(12) United States Patent
Zhang et al.

(10) Patent No.: US 12,340,047 B2
(45) Date of Patent: Jun. 24, 2025

(54) DISPLAY PANEL AND DISPLAY DEVICE

(71) Applicants: Chengdu BOE Optoelectronics Technology Co., Ltd., Chengdu (Sichuan) (CN); BOE TECHNOLOGY GROUP CO., LTD., Beijing (CN)

(72) Inventors: Yuanqi Zhang, Beijing (CN); Chang Luo, Beijing (CN); Shun Zhang, Beijing (CN); Tianci Chen, Beijing (CN); Yi Zhang, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/268,362

(22) PCT Filed: Feb. 14, 2022

(86) PCT No.: PCT/CN2022/076207
§ 371 (c)(1),
(2) Date: Jun. 20, 2023

(87) PCT Pub. No.: WO2023/151078
PCT Pub. Date: Aug. 17, 2023

(65) Prior Publication Data
US 2024/0370117 A1    Nov. 7, 2024

(51) Int. Cl.
*G06F 3/041* (2006.01)
*G06F 3/044* (2006.01)
*H10K 59/40* (2023.01)

(52) U.S. Cl.
CPC ........ *G06F 3/04164* (2019.05); *G06F 3/0412* (2013.01); *G06F 3/0418* (2013.01);
(Continued)

(58) Field of Classification Search
CPC .. G06F 3/04164; G06F 3/0412; G06F 3/0418; G06F 3/0443; G06F 3/0446;
(Continued)

(56) References Cited

U.S. PATENT DOCUMENTS 10,866,666 B2 * 12/2020 Lin .................... H10K 59/8792
11,537,253 B2    12/2022 Yan et al.
(Continued)

FOREIGN PATENT DOCUMENTS

| CN | 1683958 A | 10/2005 |
|---|---|---|
| CN | 205656396 U | 10/2016 |

(Continued)

OTHER PUBLICATIONS

Written Opinion of the International Searching Authority in PCT/CN2022/076207 in Chinese dated Oct. 26, 2022 with English translation.
(Continued)

*Primary Examiner* — Amy Onyekaba
(74) *Attorney, Agent, or Firm* — Collard & Roe, P.C.

(57) ABSTRACT

A display panel and a display device. The touch signal line is in the non-display region, surrounds the display region, is on a side of the light shielding layer close to the display region, and provides touch signals to the display region; the light shielding line is in the non-display region, surrounds the display region, and is at a side of the touch signal line away from the display region; the light shielding line is along the direction from the display region to the non-display region, the orthographic projections of the first part of the light shielding line and the light shielding layer overlaps each other, and the orthographic projection of the second part of the light shielding line is between the edge of
(Continued)

the orthographic projection of the light shielding layer close to the display area and the edge of the touch signal line away from the display area.

20 Claims, 8 Drawing Sheets

(52) U.S. Cl.
CPC .......... *G06F 3/0443* (2019.05); *G06F 3/0446* (2019.05); *H10K 59/40* (2023.02); *G06F 2203/04102* (2013.01); *G06F 2203/04107* (2013.01); *G06F 2203/04111* (2013.01)

(58) Field of Classification Search
CPC . G06F 2203/04102; G06F 2203/04107; G06F 2203/04111; H10K 59/40
See application file for complete search history.

(56) References Cited

U.S. PATENT DOCUMENTS

| | | | | |
|---|---|---|---|---|
| 2012/0113364 | A1* | 5/2012 | Hsueh | G02F 1/1339 361/764 |
| 2018/0173049 | A1* | 6/2018 | Zha | G02F 1/133602 |
| 2020/0125199 | A1* | 4/2020 | Feng | G06F 3/0443 |
| 2021/0026474 | A1* | 1/2021 | Yi | G06F 3/04164 |
| 2021/0216186 | A1* | 7/2021 | Wang | G06F 3/04164 |
| 2021/0296424 | A1 | 9/2021 | Cho et al. | |
| 2022/0028951 | A1* | 1/2022 | Xu | H10K 50/16 |
| 2022/0029137 | A1* | 1/2022 | Ko | G06F 3/0445 |
| 2023/0229248 | A1* | 7/2023 | Kim | G06F 3/0445 345/173 |
| 2024/0049524 | A1* | 2/2024 | Ren | H10K 59/126 |
| 2024/0049580 | A1* | 2/2024 | Zhou | H10K 59/126 |

FOREIGN PATENT DOCUMENTS

| | | |
|---|---|---|
| CN | 108873520 A | 11/2018 |
| CN | 109634469 A | 4/2019 |
| CN | 209400989 U | 9/2019 |
| CN | 111694465 A | 9/2020 |
| CN | 112349759 A | 2/2021 |
| CN | 112817469 A | 5/2021 |
| CN | 113192426 A | 7/2021 |
| EP | 2743765 A1 | 6/2014 |
| JP | 2014081754 A | 5/2014 |
| WO | 2020/032338 A1 | 2/2020 |

OTHER PUBLICATIONS

International Search Report in PCT/CN2022/076207 dated Oct. 26, 2022 with English translation.
Written Opinion in PCT/CN2022/076207 dated Oct. 26, 2022 in Chinese.

* cited by examiner

DISPLAY PANEL AND DISPLAY DEVICE

CROSS REFERENCE TO RELATED APPLICATIONS

This application is the National Stage of PCT/CN2022/076207 filed on Feb. 14, 2022, the disclosure of which is incorporated by reference.

TECHNICAL FIELD

At least one embodiment of the present disclosure relates to a display panel and a display device.

BACKGROUND

A display panel usually includes a display region and a non-display region, the display region is used to display the required screen, the non-display region is used to set the circuit structure for controlling the work of the display region, the circuit structure includes, for example, a display driver circuit, various lines and a flexible circuit board. The non-display region may also be arranged with various structures to ensure screen encapsulation, such as dam glue.

In a touch display panel, recognition of touch positions is usually realized by setting touch electrodes, and the touch electrodes need to be connected with the circuit board, to provide touch signals to the touch electrodes. The touch electrodes can be applied to a flexible display panel, for example, the touch electrodes may be provided between an encapsulation cover plate and a light-emitting device such as an organic light-emitting diode (OLED) device to form an integrated flexible touch display panel.

SUMMARY

At least one embodiment of the present disclosure provides a display panel, the display panel includes: a substrate, a light-shielding layer, a touch signal line and at least one light-shielding line. The substrate includes a display region and a non-display region at least partially surrounding the display region, the display region includes display pixels; the light-shielding layer is located in the non-display region and at least partially surrounds the display region; the touch signal line is located in the non-display region, at least partially surrounds the display region, and is located on a side of the light-shielding layer close to the display region, and the touch signal line is configured to provide a touch signal to the display region; the at least one light-shielding line is located in the non-display region, at least partially surrounds the display region, and is located on a side of the touch signal line away from the display region; the at least one light-shielding line is arranged along a direction from the display region to the non-display region, an orthographic projection of a first part of the at least one light-shielding line on the substrate is overlapped with an orthographic projection of the light-shielding layer on the substrate, and an orthographic projection of a second part of the at least one light-shielding line on the substrate is located between an edge of the orthographic projection of the light-shielding layer on the substrate close to the display region and an edge of the touch signal line away from the display region.

For example, in the display panel provided by at least one embodiment of the present disclosure, the at least one light-shielding line comprises an edge light-shielding line, an orthographic projection of a first part of the edge light-shielding line on the substrate is overlapped with a part of the orthographic projection of the light-shielding layer on the substrate, and an orthographic projection of a second part of the edge light-shielding line on the substrate is between the edge of the orthographic projection of the light-shielding layer on the substrate close to the display region and the edge of the touch signal line away from the display region.

For example, in the display panel provided by at least one embodiment of the present disclosure, an entire range, in a line width direction of the at least one light-shielding line, of an orthographic projection of a light-shielding line farthest away from the display region among the at least one light-shielding line on the substrate is overlapped with the orthographic projection of the light-shielding layer on the substrate, and a light-shielding line of the at least one light-shielding line adjacent to the light-shielding line farthest away from the display region among the at least one light-shielding line is the edge light-shielding line; or, among the at least one light-shielding line, the light-shielding line farthest away from the display region is the edge light-shielding line.

For example, the display panel provided by at least one embodiment of the present disclosure further comprises a first touch electrode, the first touch electrode is in the display region and comprising a plurality of first sub-touch electrodes extending along the first direction and arranged at intervals from each other; the plurality of touch signal lines are connected with the plurality of first sub-touch electrodes in one-to-one correspondence, and are configured to provide the touch signal to the corresponding first sub-touch electrodes respectively.

For example, the display panel provided by at least one embodiment of the present disclosure comprises a main ground line and an integrated circuit board, the main ground line is arranged along the touch signal line, on a side of the touch signal line away from the display region, and comprising a first part surrounding the display region and a second part connected with the first part, wherein an extension direction of the second part is intersected with an extension direction of the first part; and the integrated circuit board is configured to provide the display panel with a driving signal for controlling display, wherein the second part of the main ground line is electrically connected with the integrated circuit board.

For example, in the display panel provided by at least one embodiment of the present disclosure, the substrate further comprises a bendable part at an edge of the non-display region away from the display region, and an extension part connected with the bendable part; the display panel has a first side for display and a second side opposite to the first side, the extension part is connected with the bendable part and is able to be bent to the second side of the display panel through the bendable part; the integrated circuit board is in the extension part; the display panel has a first edge, a second edge intersecting the first edge, a third edge opposite to the first edge, and a fourth edge opposite to the second edge, and the extension part is arranged along the first edge of the display panel; the at least one light-shielding line extends along at least part of the first edge, or, the at least one light-shielding line extends along at least part of the first edge and along at least one selected from a group consisting of the second edge, the third edge and the fourth edge.

For example, in the display panel provided by at least one embodiment of the present disclosure, the at least one light-shielding line comprises at least one auxiliary ground line, the extending along the first part of the main ground line, and on a side of a first part of the main ground line away from the display region; an orthographic projection of an auxiliary ground line farthest away from the display region among the at least one auxiliary ground line on the substrate is at least partially overlapped with the orthographic projection of the light-shielding layer on the substrate, and an orthographic projection of a part of the at least one auxiliary ground line on the substrate is between the edge of the orthographic projection of the light-shielding layer on the substrate close to the display region and an edge of the first part of the main ground line away from the display region; and the auxiliary ground line is electrically connected with the main ground line, or, the auxiliary ground line is directly electrically connected with the integrated circuit board.

For example, in the display panel provided by at least one embodiment of the present disclosure, a first end of each of the at least one auxiliary ground line is connected with the second part of the main ground line, a second end of each of the at least one auxiliary ground line is connected or not connected with the first part of the main ground line; the first part of the main ground line comprises: a first sub-part, a second sub-part, and a bent part. The first sub-part extends along the first edge; the second sub-part extends along the second edge; the bent part is at a junction region between the first edge and the second edge and connects the first sub-part and the second sub-part; the at least one auxiliary ground line extends along the first edge; and in the case that the second end of each of the at least one auxiliary ground line is connected with the first part of the main ground line, the second end of each of the at least one auxiliary ground line is connected with the bent part.

For example, in the display panel provided by at least one embodiment of the present disclosure, the at least one auxiliary ground line is substantially parallel to the first part of the main ground line; and a line width of each of the at least one auxiliary ground line in the direction from the display region to the non-display region is equal to a line width of the first part of the main ground line in the direction from the display region to the non-display region, and the at least one auxiliary ground line and the first part of the main ground line are arranged at an equal interval from each other.

For example, the display panel provided by at least one embodiment of the present disclosure further comprises an auxiliary connection part, the auxiliary connection part is across a gap between two adjacent auxiliary ground lines among the at least one auxiliary ground line and connecting the two adjacent auxiliary ground lines.

For example, in the display panel provided by at least one embodiment of the present disclosure, the at least one light-shielding line comprises the first part of the main ground line, and a total number of the main ground line is 1; a line width of one of the main ground line in the direction from the display region to the non-display region is greater than a line width of one of the touch signal line in the direction from the display region to the non-display region, an orthographic projection of the first part of the main ground line on the substrate is at least partially overlapped with the orthographic projection of the light-shielding layer on the substrate, and an orthographic projection of the first part of part of the main ground line on the substrate is between the edge of the orthographic projection of the light-shielding layer on the substrate close to the display region and the edge of a touch signal line away from the display region.

For example, in the display panel provided by at least one embodiment of the present disclosure, the at least one light-shielding line comprises at least one first floating line, the at least one first floating line extends along the first part of the main ground line, is on a side of the main ground line away from the display region, and is disconnected with the main ground line; an orthographic projection of a first floating line farthest away from the display region among the at least one first floating line on the substrate is at least partially overlapped with the orthographic projection of the light-shielding layer on the substrate, an orthographic projection of a part of the at least one first floating line on the substrate is between the edge of the orthographic projection of the light-shielding layer on the substrate close to the display region and an edge of the first part of the main ground line away from the display region.

For example, in the display panel provided by at least one embodiment of the present disclosure, each of the at least one first floating line is substantially parallel to the first part of the main ground line; and a line width of each of the at least one first floating line in the direction from the display region to the non-display region is equal to a line width of the first part of the main ground line in the direction from the display region to the non-display region, and the at least one first floating line and the first part of the main ground line are arranged at an equal interval from each other.

For example, the display panel provided by at least one embodiment of the present disclosure further comprises a protection line, the protection line is arranged along the touch signal line and between the touch signal line and the main ground line, a waveform of an electrical signal transmitted by the protection line is basically same as a waveform of an electrical signal transmitted by the touch signal line, wherein the protection line comprises a first part surrounding the display region; the at least one light-shielding line comprises: a second floating line, the second floating line is between the first part of the protection line and the first part of the main ground line, and does not transmit any electrical signal.

For example, in the display panel provided by at least one embodiment of the present disclosure, the second floating line is substantially parallel to the first part of the protection line and the first part of the main ground line; and a line width of the second floating line in the direction from the display region to the non-display region is smaller than a line width of the first part of the protection line in the direction from the display region to the non-display region, and is less than a line width of the first part of the main ground line in the direction from the display region to the non-display region; or, the line width of the second floating line in the direction from the display region to the non-display region is equal to the line width of the first part of the protection line in the direction from the display region to the non-display region, and is equal to the line width of the first part of the main ground line in the direction from the display region to the non-display region.

For example, in the display panel provided by at least one embodiment of the present disclosure, the protection line further comprises a second part connected with the first part of the protection line, an extension direction of the second part of the protection line is intersected with an extension direction of the first part of the protection line; the touch signal line comprises a first part surrounding the display region and a second part connected with the first part of the touch signal line, an extension direction of the second part of the touch signal line is intersected with the extension direction of the first part of the touch signal line; the integrated circuit board comprises a plurality of integrated circuit board pins, the second part of the main ground line, the second part of the protection line, and the second part of the touch signal line are respectively connected with the plurality of integrated circuit board pins.

For example, in the display panel provided by at least one embodiment of the present disclosure, the at least one light-shielding is made of a same material as the touch signal line and arranged in a same layer.

For example, the display panel provided by at least one embodiment of the present disclosure further comprises a second touch electrode and a bridge electrode. The second touch electrode is in the display region and comprising a plurality of second touch electrode channels that extend along the second direction and are arranged at intervals from each other; the second direction is intersected with the first direction; the plurality of second touch electrode channels and the plurality of first sub-touch electrodes are arranged in the same layer and are insulated from each other, the plurality of first touch electrode channels comprise a plurality of first sub-touch electrodes arranged at intervals; and the bridge electrode is arranged in a layer different from that in which the plurality of second sub-touch electrodes and the plurality of first sub-touch electrodes are located, and electrically connects two adjacent first sub-touch electrodes among the plurality of first sub-touch electrodes of the same one first touch electrode channel, and insulated from the second touch electrode; both the light-shielding line and the touch signal line are made of a same material as the first touch electrode and the second touch electrode, and the light-shielding line, the touch signal line, the first touch electrodes and the second touch electrodes are in the same layer, or, both the light-shielding line and the touch signal line are made of a same material as the bridge electrode, and the light-shielding line, the touch signal line and the bridge electrode are in the same layer.

For example, in the display panel provided by at least one embodiment of the present disclosure, the at least one light-shielding line comprises a first part light-shielding line and a second part light-shielding line, the first part light-shielding line is made of a same material as the touch signal line and in a same layer as the touch signal line, and the second part light-shielding line and the touch signal line are respectively in different layers.

For example, in the display panel provided by at least one embodiment of the present disclosure, the first part light-shielding lines are arranged at intervals from each other, an orthographic projection of the second part light-shielding line on the substrate is at least partially overlapped with an orthographic projection of the intervals among the first part light-shielding lines on the substrate.

For example, the display panel provided by at least one embodiment of the present disclosure further comprises a second touch electrode and a bridge electrode, the second touch electrode is in the display region and comprising a plurality of second touch electrode channels extending along the second direction and arranged at intervals from each other; the second direction is intersected the first direction; the plurality of second touch electrode channels and the plurality of first sub-touch electrodes are in a same layer and are insulated from each other, the plurality of second touch electrode channels comprise a plurality of second sub-touch electrodes arranged at intervals; the bridge electrode is arranged in a layer different from that in which the plurality of second sub-touch electrodes and the plurality of first sub-electrodes are located, electrically connecting two adjacent first sub-touch electrodes among the plurality of first sub-touch electrodes of the same one second touch electrode channel, and insulated from the second touch electrode; the first part of the light-shielding line is made of a same material as both the first touch electrodes and the second touch electrodes, and the first part of the light-shielding line, the first touch electrodes and the second touch electrodes are in a same layer, and the second part of the light-shielding line is made of a same material as the bridge electrode, and the second part of the light-shielding line and the bridge electrode are in a same layer.

For example, the display panel provided by at least one embodiment of the present disclosure further comprises a dam glue, the dam glue is at least partially surrounding the display region, wherein the touch signal line is on a side of the dam glue close to the display region, and the light-shielding layer is at least partially overlapped with the dam glue in a direction perpendicular to the substrate.

For example, the display panel provided by at least one embodiment of the present disclosure further comprises an encapsulation cover plate, an optical adhesive layer, a polarization structure layer, a pixel driver circuit layer, and a touch electrode structure layer. The encapsulation cover plate is opposite to the substrate, the light-shielding layer is on a surface of the encapsulation cover plate close to the substrate; an optical adhesive layer is on a side of both the encapsulation cover plate and the light-shielding layer close to the substrate; the light-shielding layer is in contact with the optical adhesive layer; the polarization structure layer is on a side of the optical adhesive layer close to the substrate; the pixel driver circuit layer is configured to control operations of the display pixels, and on a side of the polarization structure layer close to the substrate; and the touch electrode structure layer comprises the first touch electrodes and the second touch electrodes, and between the pixel driver circuit layer and the polarization structure layer.

At least one embodiment of the present disclosure provides a display device, the display device comprises the display panel provided by any one of the embodiments of the present disclosure.

BRIEF DESCRIPTION OF THE DRAWINGS

In order to clearly illustrate the technical solution of the embodiments of the present disclosure, the drawings of the embodiments will be briefly described. It is obvious that the described drawings in the following are only related to some embodiments of the present disclosure and thus are not construed as any limitation to the present disclosure.

DETAILED DESCRIPTION

Figure 1:
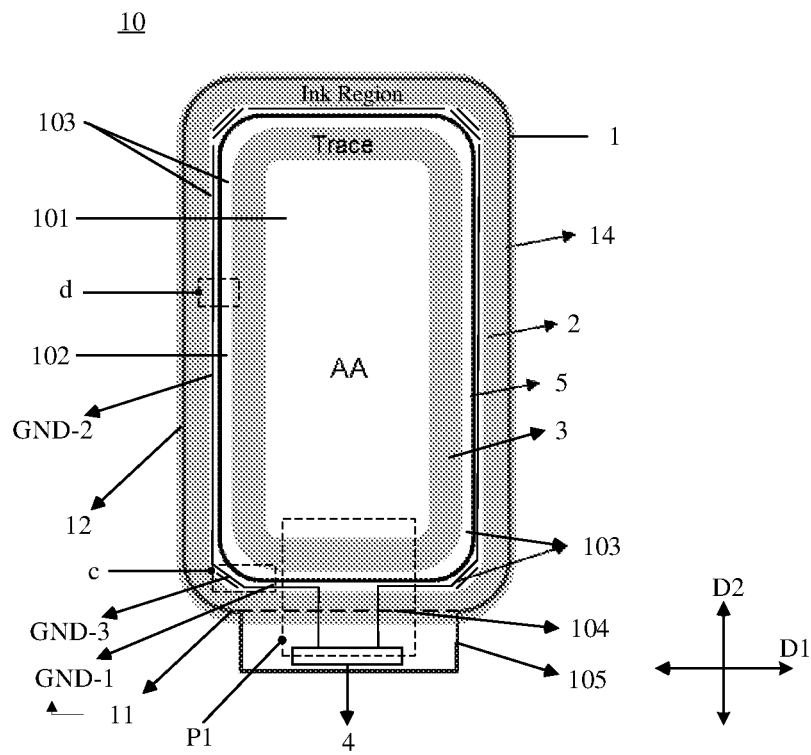
FIG. 1 is a schematic diagram of a display panel provided by an embodiment of the present disclosure.

In order to make objectives, technical details, and advantages of the embodiments of the present disclosure more clear, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first", "second", etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "left," "right," and the like are only used to indicate relative position relationship, and when the position of the described object is changed, the relative position relationship may be changed accordingly.

Because of the existence of various wires of the display panel, after the light is reflected and refracted between the layers in the non-display region, in the case that the display panel is in an off-screen state, the user can still see light reflected from the non-display region, therefore a light leakage phenomenon is formed. In order to prevent light leakage that occurs in the non-display region of the display panel, for example, a light-shielding layer may be coated in the non-display region, to block the light. However, the light-shielding layer causes problems such as lamination tolerance and production tolerance, and it must meet the needs of the whole machine, a certain distance exists between the edge of the light-shielding layer and the display region. In this case, because a light leakage region not blocked by the light-shielding layer exists between the edge of the light-shielding layer close to the display region and the display region, light in the light leakage region cannot be blocked, light is transmitted from the light leakage region.

At least one embodiment of the present disclosure provides a display panel, the display panel includes: a substrate, a light-shielding layer, a touch signal line and at least one light-shielding line. The substrate includes a display region and a non-display region at least partially surrounding the display region, the display region includes display pixels; the light-shielding layer is located in the non-display region and at least partially surrounds the display region; the touch signal line is located in the non-display region, at least partially surrounds the display region, and is located on a side of the light-shielding layer close to the display region, and the touch signal line is configured to provide a touch signal to the display region; the at least one light-shielding line is located in the non-display region, at least partially surrounds the display region, and is located on a side of the touch signal line away from the display region; the at least one light-shielding line is arranged along a direction from the display region to the non-display region, an orthographic projection of a first part of the at least one light-shielding line on the substrate is overlapped with an orthographic projection of the light-shielding layer on the substrate, and an orthographic projection of a second part of the at least one light-shielding line on the substrate is located between an edge of the orthographic projection of the light-shielding layer on the substrate close to the display region and an edge of the touch signal line away from the display region.

The display panel provided by the embodiment of the present disclosure will be described below with reference to exemplary drawings. It should be noted that the number of the light-shielding line in the embodiment of the present disclosure, such as the number of the auxiliary ground line, the number of the first floating line, and the number of the second floating line, are not limited to the numbers shown in the figures, those skilled in the art can design according to a size of the light leakage region. The size of each structure in the drawings does not represent the actual size, and all the drawings are schematic diagrams.

Figure 3:
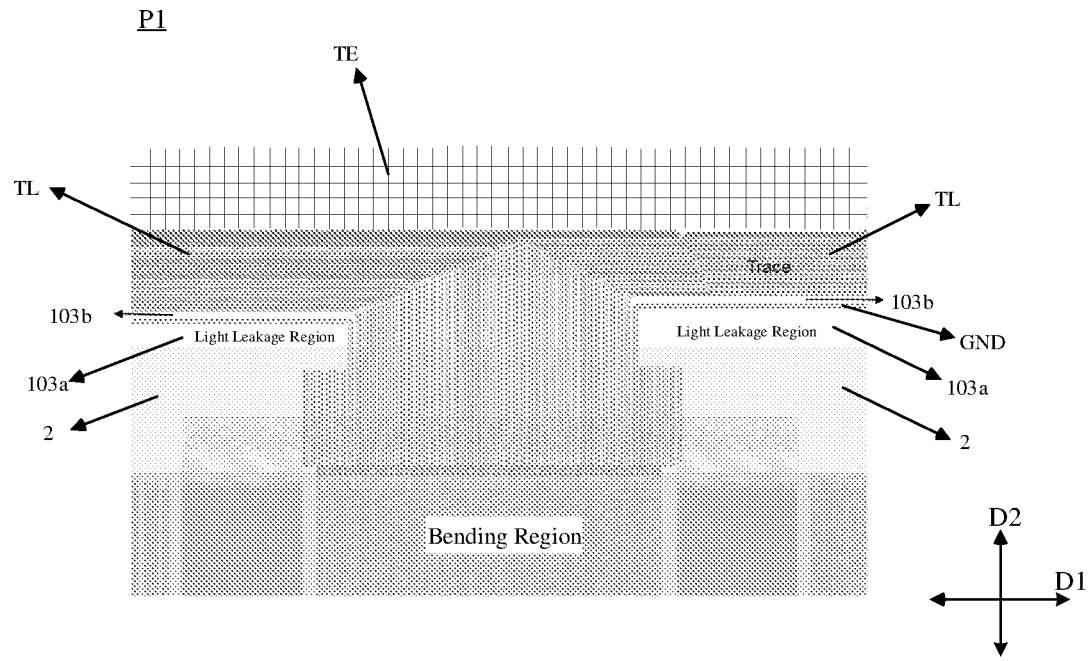
FIG. 3 is a schematic diagram after removing the light-shielding lines in the part P1 of the display panel shown in FIG. 1.
Figure 4A:
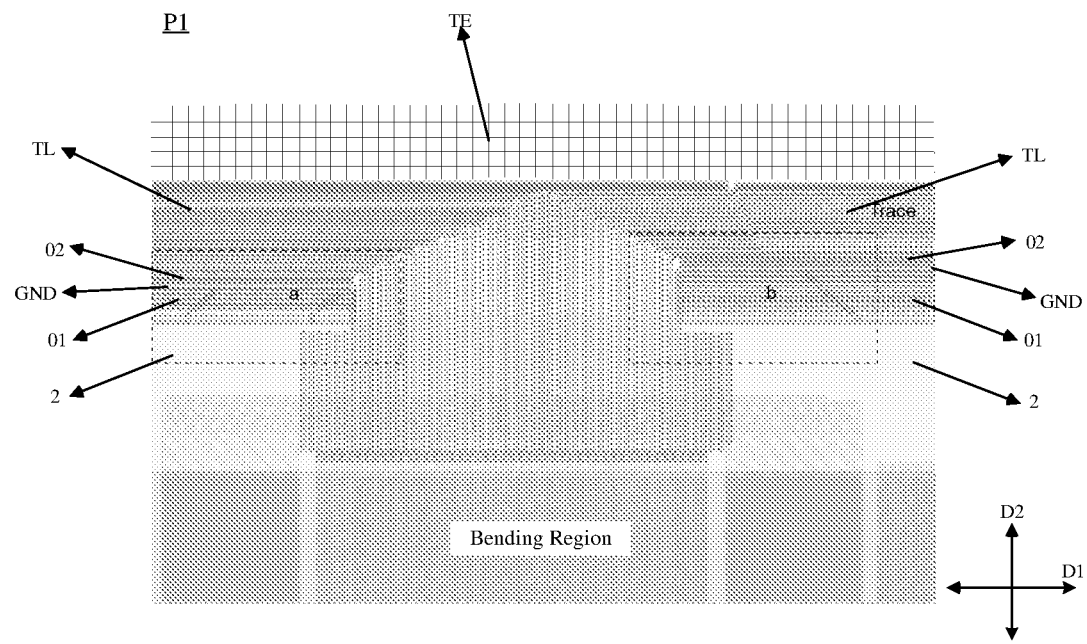
FIG. 4A is a schematic diagram of a part P1 including a light-shielding line in a part near the first edge of the non-display region shown in FIG. 1.
Figure 4B:
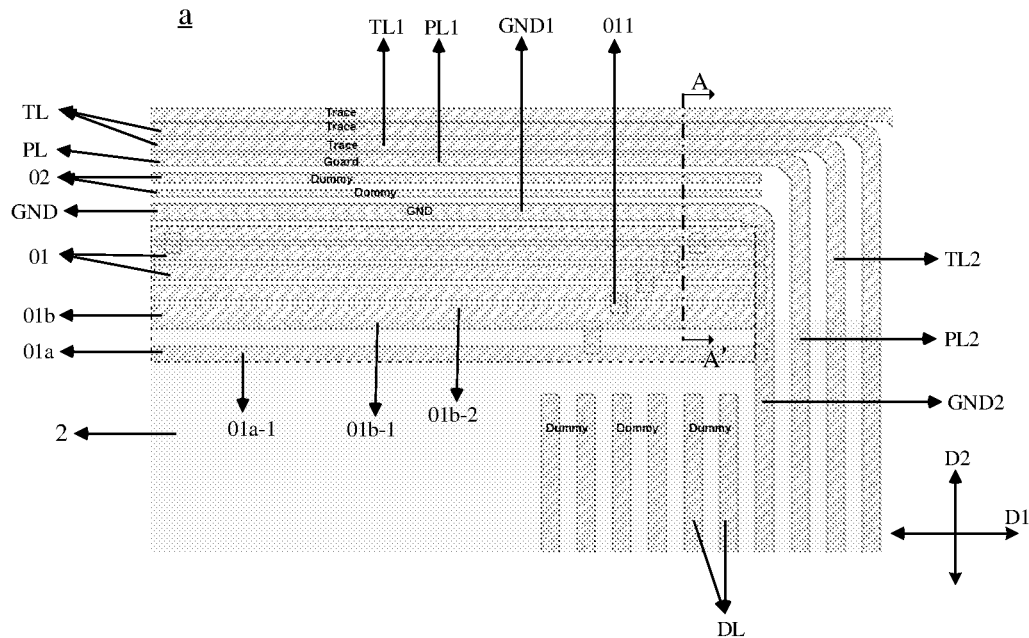
FIG. 4B is an enlarged schematic diagram of a part a including a light-shielding line in FIG. 4A.

Exemplarily, FIG. 1 is a schematic diagram of a display panel provided by an embodiment of the present disclosure, FIG. 3 is a schematic diagram after removing the light-shielding lines in the part P1 of the display panel shown in FIG. 1, FIG. 4A is a schematic diagram of the part P1 including the light-shielding lines in a part close to the first edge of the non-display region shown in FIG. 1; and FIG. 4B is an enlarged schematic diagram of the part a including the light-shielding lines in FIG. 4A. Referring to FIG. 1, FIG. 3 and FIGS. 4A to 4B, the display panel 10 provided by at least one embodiment of the present disclosure includes a substrate 1, a light-shielding layer 2, a plurality of touch signal lines TL and at least one light-shielding line 01/02. The substrate 1 includes a display region 101 and a non-display region 102 at least partially surrounding the display region 101, the display region 101 includes display pixels; the light-shielding layer 2 is located in the non-display region 102 and at least partially surrounds the display region 101; the touch signal lines TL are located in the non-display region 102, at least a part of the touch signal lines TL surrounds the display region 101, and the touch signal lines TL are on a side of the light-shielding layer 2 close to the display region 101, and the touch signal lines TL are configured to provide touch signals to the display region 101; the at least one light-shielding line 01/02 is located in the non-display region 102, at least partially surrounds the display region 101, and is on a side of the touch signal lines TL away from the display region 101; the at least one light-shielding line 01/02 is arranged along a direction from the display region 101 to the non-display region 102, an orthographic projection of a light-shielding line farthest away from the display region 101 among the at least one light-shielding line 01/02 on the substrate 1 is at least partially overlapped with an orthographic projection of the light-shielding layer 2 on the substrate 1, and an orthographic projection of a part of the at least one light-shielding line on the substrate 1 is located between an edge of the orthographic projection of the light-shielding layer 2 on the substrate 1 close to the display region 101 and an edge of any one of the touch signal lines TL away from the display region 101. In a region of the non-display region 102 close to the display region 101, various wires are provided, such as a plurality of touch signal lines TL, and ground lines, but a plurality of touch signal lines TL are arranged at intervals from each other, and some gaps are between the touch signal lines TL and other wires, due to bonding tolerance and manufacturing tolerance of the light-shielding layer, as well as the spacing between various wires, the light-shielding layer and various lines cannot completely cover the non-display region 102 where light leakage is likely to occur, which results in that there is still a light leakage region where light leakage occurs in the uncovered region of the non-display region 102, for example, there is light leakage at the edges of the screen. In the embodiment of the present disclosure, a gap between the edge of the light-shielding layer 2 close to the display region 101 and the edge of the touch signal line TL away from the display region 101 is blocked by the light-shielding lines 01/02, that is, to block the light leakage region, and a phenomenon of light leakage at the edges of the display screen of the display panel is reduced.

For example, in the embodiment shown in FIG. 4B, the display panel 10 includes a plurality of light-shielding lines 01/02, the plurality of light-shielding lines 01/02 are arranged at intervals along the direction from the display region 101 to the non-display region 102 (for example, a second direction D2). Each of the plurality of light-shielding lines 01/02 includes a first part surrounding the display region 101, that is, the first part extending along the first direction D1. The light-shielding line farthest away from the display region 101 among the plurality of light-shielding lines 01/02 is the light-shielding line 01a; FIG. 4D is a cross-sectional schematic diagram taken along a line A-A' in FIG. 4A, referring to FIG. 4B and FIG. 4D, the entire range, in a line width direction of the first part 01a-1 of the light-shielding line 0la, of the orthographic projection of the first part 0la-1 of the light-shielding line 0la on the substrate 1 is overlapped with the orthographic projection of the light-shielding layer 2 on the substrate 1, in order to ensure that there is still no light leakage region as far as possible in the case that the light-shielding layer 2 has the lamination deviation, a better effect of preventing light leakage at the edge of the display panel is obtained. Moreover, the orthographic projection of at least part of the light-shielding lines 01/02 except for the light-shielding line 01a on the substrate 1 among the plurality of light-shielding lines 01/02 is located between the edge of the orthographic projection of the light-shielding layer 2 on the substrate 1 close to the display region 101 and the edge of any one of the touch signal lines TL away from the display region 101. Therefore, it can be ensured that the plurality of light-shielding lines 01 can fully fill the gap between the edge of the light-shielding layer 2 close to the display region 101 and the edge of any one of the touch signal lines TL away from the display region 101, and an effect of shielding the light leakage region by using the plurality of light-shielding lines 01 is ensured.

For example, as shown in FIG. 4B and FIG. 4D, the at least one light-shielding line further includes an edge light-shielding line 01b, an orthographic projection of the first part 01b-1 of the edge light-shielding line 01b on the substrate 1 is overlapped with the orthographic projection of the light-shielding layer 2 on the substrate 1, and an orthographic projection of a second part 01b-2 of the edge light-shielding line 01b on the substrate 1 is located between the edge of the orthographic projection of the light-shielding layer 2 on the substrate 1 close to the display region 101 and the edge of the touch signal line TL away from the display region 101, to better shield the light leakage region near the edge of the display region 101 of the orthographic projection of the light-shielding layer 2 on the substrate 1, further ensuring better shielding of the gap between the edge of the light-shielding layer 2 close to the display region 101 and the edge of the touch signal line TL away from the display region 101, so that a better light leakage prevention effect is obtained.

In the embodiment shown in FIG. 4B and FIG. 4D, the entire range, in a line width direction of the light-shielding line 01a, of the orthographic projection of the light-shielding line 01a farthest away from the display region 101 among the at least one light-shielding line on the substrate 1 is overlapped with the orthographic projection of the light-shielding layer 2 on the substrate 1, and among the at least one light-shielding line, the light-shielding line 01b adjacent to the light-shielding line 01a farthest away from the display region 101 is called an edge light-shielding line.

For example, in another embodiment, the light-shielding line 0la in FIG. 4B can also be removed, that is, the light-shielding line farthest away from the display region 101 among the plurality of light-shielding lines 01/02 is the light-shielding line 01b, and the light-shielding line 01b also serves as the edge light-shielding line. In this case, the light-shielding line 01b farthest away from the display region 101 among the at least one light-shielding line serves as the edge light-shielding line.

In the embodiment shown in FIG. 4B, the first part of the at least one light-shielding line refers to the first part 01a-1 of the light-shielding line 01a and a first part 01b-1 of the edge light-shielding line 01b, the second part of the at least one light-shielding line refers to the second part 01b-2 of the edge light-shielding line 01b and a part of plurality of light-shielding lines among the plurality of light-shielding lines 01 except the light-shielding line 0la and the edge light-shielding line 01b that is located between the edge close to the display region of the orthographic projection of the light-shielding layer 2 on the substrate 1 and the edge of the touch signal line TL away from the display region 101.

It should be noted that, in the present disclosure, the feature "an orthographic projection of the light-shielding line farthest away from the display region among the at least one light-shielding line on the substrate is at least partially overlapped with the orthographic projection of the light-shielding layer on the substrate" includes the case that the edge of the orthographic projection of the light-shielding line farthest away from the display region on the substrate and the edge the orthographic projection of the light-shielding layer on the substrate that are close to each other are at least partly overlapped with each other.

It should also be noted that, in the present disclosure, the feature "the orthographic projection of the first part of the at least one light-shielding line on the substrate is overlapped with the orthographic projection of the light-shielding layer on the substrate" includes the case that the orthographic projection of a plurality of light-shielding lines among the at least one light-shielding line on the substrate are overlapped with the orthographic projection of the light-shielding layer on the substrate, and also includes the case where the orthographic projection of a part of one light-shielding line among the at least one light-shielding line on the substrate is overlapped with the orthographic projection of the light-shielding layer on the substrate. In the present disclosure, "the orthographic projection of the second part of the at least one light-shielding line on the substrate is located between the edge of the orthographic projection of the light-shielding layer on the substrate close to the display region and the edge of the touch signal line away from the display region" includes the case that orthographic projections of a plurality of light-shielding lines among the at least one light-shielding line on the substrate are located between the edge of the orthographic projection of the light-shielding layer on the substrate close to the display region and the edge of the touch signal lines away from the display region, and also includes the case that the orthographic projection of a part of one light-shielding line among the at least one light-shielding line on the substrate is located between the edge of the orthographic projection of the light-shielding layer on the substrate that is close to the display region and the edge of the touch signal lines that is away from the display region.

For example, a material of the light-shielding layer 2 is an organic material, for example, opaque ink, such as black ink, or opaque ink of other colors. The embodiment of the present disclosure does not limit the type of the light-shielding layer 2, as long as the light-shielding layer 2 is opaque and can block the light leakage from the non-display region due to refraction and reflection, and prevent the light leakage from being projected out of the display screen.

Figure 2:
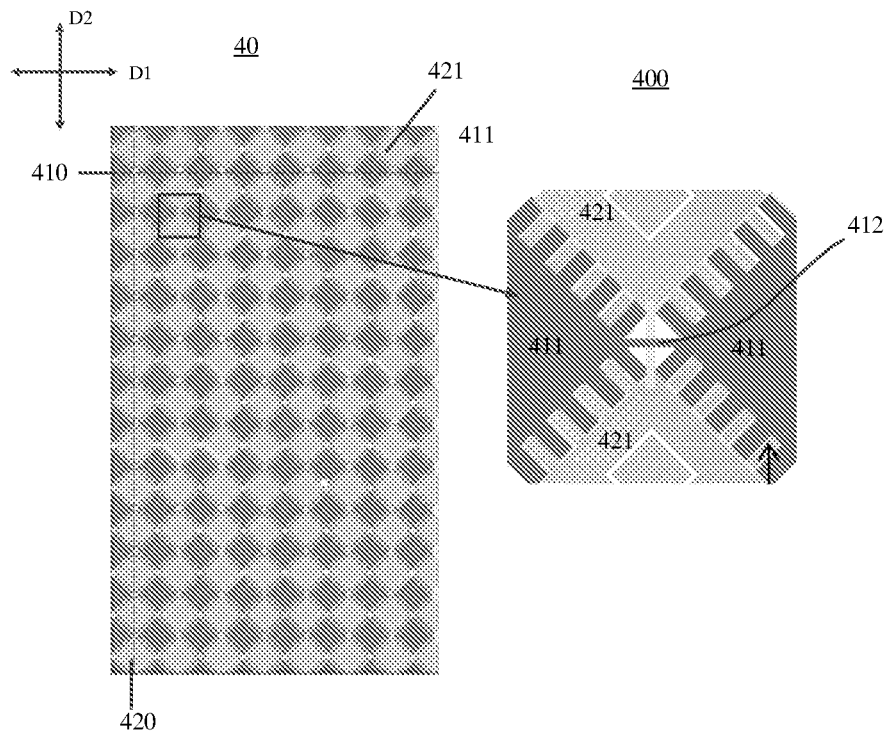
FIG. 2 is a schematic diagram of a touch structure of a display panel provided by an embodiment of the present disclosure.

FIG. 2 is a schematic diagram of a touch electrode structure 40 of a display panel 10 provided by an embodiment of the present disclosure. As shown in FIG. 2, the touch electrode structure 40 is located in the display region 101 and includes first touch electrodes and second touch electrodes. The first touch electrodes include a plurality of first touch electrode channels 410 extending along the first direction D1 and arranged at intervals from each other (one first touch electrode channel 410 is at the position indicated by the corresponding dotted line in FIG. 2), the second touch electrodes include a plurality of second touch electrode channels 420 extending along the second direction D2 and arranged at intervals (one of the second touch electrode channels 420 is at the position indicated by the corresponding dotted line in FIG. 2). The second direction D2 is intersected with the first direction D1, for example, the second direction D2 is perpendicular to the first direction D1. For example, the first touch electrode channels 410 are touch sensing electrodes Rx, and the second touch electrode channels 420 are touch driving electrodes Tx. However, the embodiments of the present disclosure do not limit this. In other examples, the first touch electrode channels 410 may be touch driving electrodes Tx, and the second touch electrode channels 420 are touch sensing electrodes Rx.

Each of the first touch electrode channels 410 includes a plurality of first sub-touch electrodes 411 arranged at intervals, and each of the second touch electrode channels 420 includes a plurality of second sub-touch electrodes 421 sequentially arranged along the second direction D2 and connected with each other. Each of the plurality of first touch electrode channels 410 includes a plurality of first sub-touch electrodes 411 arranged at intervals. For example, the plurality of second touch electrode channels 420 and the plurality of first touch electrode channels 410 are arranged in a same layer and are insulated from each other. The touch structure further includes bridge electrodes 412, the bridge electrodes 412 are arranged in a layer different from that in which the plurality of second sub-touch electrodes 421 and the plurality of first sub-touch electrodes 411 are located, and are electrically connected with two adjacent first sub-touch electrodes 411 among the plurality of first sub-touch electrodes 411 of the same one second touch electrode channel 420, and the bridge electrodes 412 are insulated from the second touch electrode channel 420; the plurality of second touch electrode channels 420 and the plurality of first sub-touch electrodes 411 are arranged in a same layer and are insulated from each other. That is, adjacent first sub-touch electrodes 411 in the first direction D1 are electrically connected through the bridge electrode 412 to form a first touch electrode channel 410, and the second sub-touch electrodes 421 adjacent in the second direction D2 are electrically connected through a second connection electrode (not shown) to form a second touch electrode channel 420.

The embodiments of the present disclosure do not limit the shapes of the main body outlines of each of the first sub-touch electrodes 411 and the second sub-touch electrodes 421, for example, as shown in FIG. 2, the shapes of the main body outlines of each of the first sub-touch electrodes 411 and the second sub-touch electrodes 421 is rhombus. In other examples, the first sub-touch electrodes 411 and the second sub-touch electrodes 421 may also be in other shapes, such as rectangular, triangular and other shapes.

Each of the first touch electrode channels 410 and each of the second touch electrode channels 420 are insulated from each other and are intersected with each other to form a plurality of touch units 400 at the intersection positions, each of the touch units includes a part of each of two first touch electrode parts connected with each other at the intersection and at least a part of each of two second touch electrode parts connected with each other at the intersection. The right side of FIG. 2 shows an enlarged schematic diagram of the touch unit 400. As shown in FIG. 2, each of the touch units 400 includes half region of two first sub-touch electrodes 411 adjacent to each other and half region of two second sub-touch electrodes 421 adjacent to each other, that is, a region including one first sub-touch electrode 411 and one second sub-touch electrode 421 on average, the intersection point of the first sub-touch electrodes 411 and the second sub-touch electrodes 421 in each of the touch units 400 (that is, the intersections of the bridge electrodes and the second connection electrodes) is used as the reference point for calculating coordinates of the touch point. When a finger touches the capacitive screen, coupling between the first touch electrode and the second touch electrode near the touch point is affected, so that a mutual capacitance between the two electrodes is changed. The touch sensing signal changes according to the capacitance variation of the touch screen, so that the coordinate of each touch point can be calculated based on the reference point.

For example, the plurality of touch signal lines TL are connected with the plurality of touch driving electrodes in one-to-one correspondence and are configured to provide touch signals to the corresponding touch driving electrodes respectively. For example, in the case that the first touch electrode channel 410 is the touch driving electrode Tx, the plurality of touch signal lines TL are connected with the plurality of first touch electrode channels 410 in one-to-one correspondence and are configured to provide touch signals to the corresponding first touch electrode channels 410 respectively. Of course, in other embodiments, in the case that the second touch electrode channel 420 is the touch driving electrode Tx, the plurality of touch signal lines TL are connected with the plurality of second touch electrode channels 420 in one-to-one correspondence and are configured to provide touch signals to the corresponding second touch electrode channels 420 respectively.

For example, as shown in FIGS. 4A to 4B, the display panel 10 includes a main ground line GND and an integrated circuit (IC) board 4. The main ground line GND is arranged along a touch signal line TL and is located on a side of the touch signal line TL away from the display region 101, to prevent the touch signal line TL from being disturbed by interference signals. The main ground line GND includes a first part GND1 surrounding the display region 101 and a second part GND2 connected with the first part, an extension direction of the second part GND2 is intersected with an extension direction of the first part GND1; for example, the first part GND1 extends along the first direction D1, at least along the first edge 11 of the display panel 10 (as shown in FIG. 1); the second part GND2 extends along the second direction D2 to match extension directions of the plurality of touch signal lines TL, the limited space is rationally utilized. The integrated circuit board 4 is configured to provide the display panel 10 with driving signals for controlling display, the second part GND2 of the main ground line GND is electrically connected with the integrated circuit board 4, and provides a ground signal to the main ground line GND through the integrated circuit board 4.

For example, as shown in FIG. 1, the substrate 1 further includes a bendable part 104 located at an edge of the non-display region 102 away from the display region 101, and an extension part 105 connected with the bendable part 104; the display panel 10 is has a first side for display and a second side opposite to the first side, the extension part 105 is connected with the bendable part 104 and is able to be bent to the second side of the display panel 10 through the bendable part 104; and the integrated circuit board 4 is located in the extension part 105.

For example, as shown in FIG. 1, the display panel 10 has a first edge 11, a second edge 12 intersecting with the first edge 11, a third edge 13 opposite to the first edge 11 and a fourth edge 14 opposite to the second edge 12, and the extension part 105 is arranged along the first edge 11 of the display panel 10. The at least one light-shielding line extends along at least part of the first edge 11, or, at least one light-shielding line extends along the at least part of the first edge 11, and extends along at least one selected from a group consisting of the second edge 12, the third edge 13 and the fourth edge 14.

Referring to the schematic diagram of the non-display region near the first edge 11 after the light-shielding line in FIG. 3 is removed, the light leakage region near the first edge 11 of the integrated circuit board 4 is relatively large, especially the first light leakage region 103a between the light-shielding layer 2 and the main ground line GND is relatively large, it is required to provide sufficient light-shielding lines in the first light leakage region 103a near the first edge 11. For example, light-shielding lines may also be arranged along other edges such as at least one selected from the group consisting of the second edge 12, the third edge 13 and the fourth edge 14. For example, the first edge 11 is provided with more light-shielding lines than other edges.

As shown in FIGS. 4A to 4B, for example, the at least one light-shielding line includes at least one auxiliary ground line 01, in the embodiment shown in FIG. 4B, the light-shielding line includes a plurality of auxiliary grounding lines 01. The plurality of auxiliary ground lines 01 extend along the first part GND1 of the main ground line GND, and are on the side away from the display region 101 of the first part GND1 of the main ground line GND. The light-shielding line farthest away from the display region 101 among the plurality of auxiliary grounding lines 01 is the light-shielding line 01a, combined with FIG. 4B and FIG. 4D, the entire range, in the line width direction of the first part 01a-1 of the light-shielding line 01a, of the orthographic projection of the first part 01a-1 (that is, a part extending along the first edge 11) of the light-shielding line 01a surrounding the display region 101 on the substrate 1 is overlapped with the orthographic projection of the light-shielding layer 2 on the substrate 1; in addition, the orthographic projection of at least a part of the auxiliary ground lines 01 except the light-shielding line O1a on the substrate 1 among the plurality of auxiliary ground lines 01 are located between the edge of the orthographic projection of the light-shielding layer 2 on the substrate 1 close to the display region 101 and the edge of the main ground line GND away from the display region 101. Therefore, it can be ensured that the plurality of auxiliary ground lines 01 can fully fill the gap between the edge of the light-shielding layer 2 close to the display region 101 and the edge of the main ground line GND away from the display region 101, so that the effect of shielding the light leakage region by using the plurality of light-shielding lines 01 is ensured.

The plurality of auxiliary ground lines 01 are also connected with the ground signal, so that the light-shielding line can be further used as a ground line to better prevent the touch signal lines TL from being interfered by the interference signal. For example, the plurality of auxiliary ground lines 01 are electrically connected with the main ground line GND, or in other embodiments, the plurality of auxiliary ground lines 01 are directly electrically connected with the integrated circuit board 4, that is, the auxiliary ground lines 01 are not electrically connected with the integrated circuit board 4 via the main ground line GND or other lines, but are directly electrically connected with the integrated circuit board 4.

For example, in another embodiment, the difference between this embodiment and the embodiment shown in FIG. 4B is that the auxiliary ground line 01a is removed on the basis of FIG. 4B, and the other structures are the same as those in FIG. 4B. In this case, the auxiliary ground line farthest away from the display region 101 among the plurality of auxiliary ground lines 01 is the auxiliary ground line 01b, the orthographic projection of the first part 01b-1 of the auxiliary ground line 01b on the substrate 1 is overlapped with the orthographic projection of the light-shielding layer 2 on the substrate 1, and the orthographic projection of the second part 01b-2 of the auxiliary ground line 01b on the substrate 1 is located between the edge of the orthographic projection of the light-shielding layer 2 on the substrate 1 close to the display region 101 and the edge of the first part GND1 of the main ground line GND away from the display region 101. That is, in this case, the auxiliary ground line farthest away from the display region 101 among the plurality of auxiliary ground lines 01 is the above-mentioned edge light-shielding line.

Figure 4E:
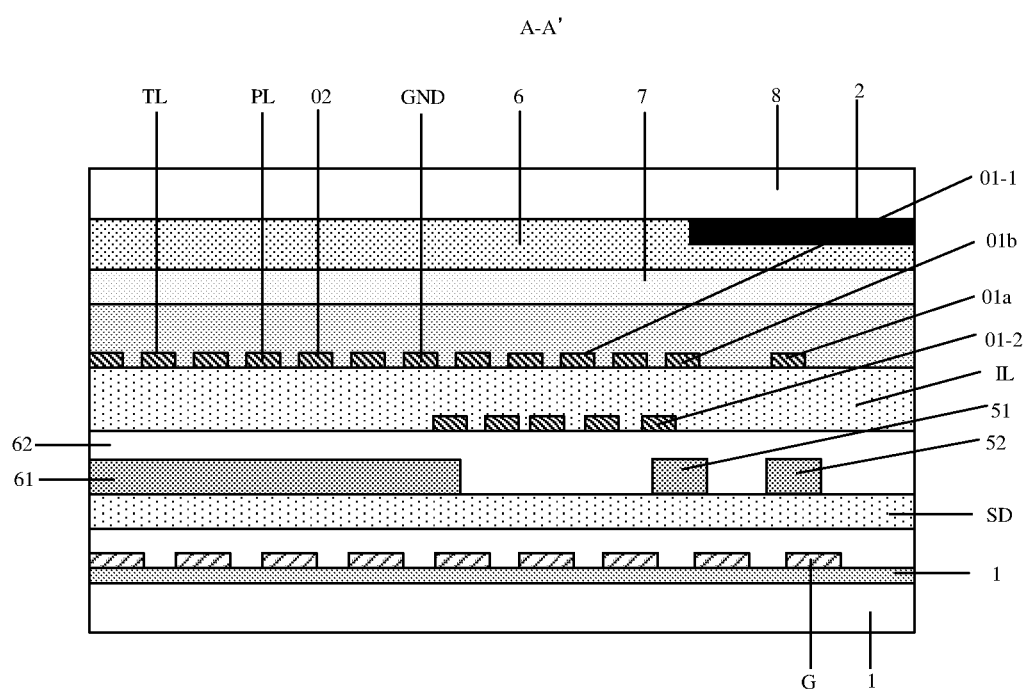
FIG. 4E is another cross-sectional schematic diagram taken along the line A-A' in FIG. 4A.
Figure 5:
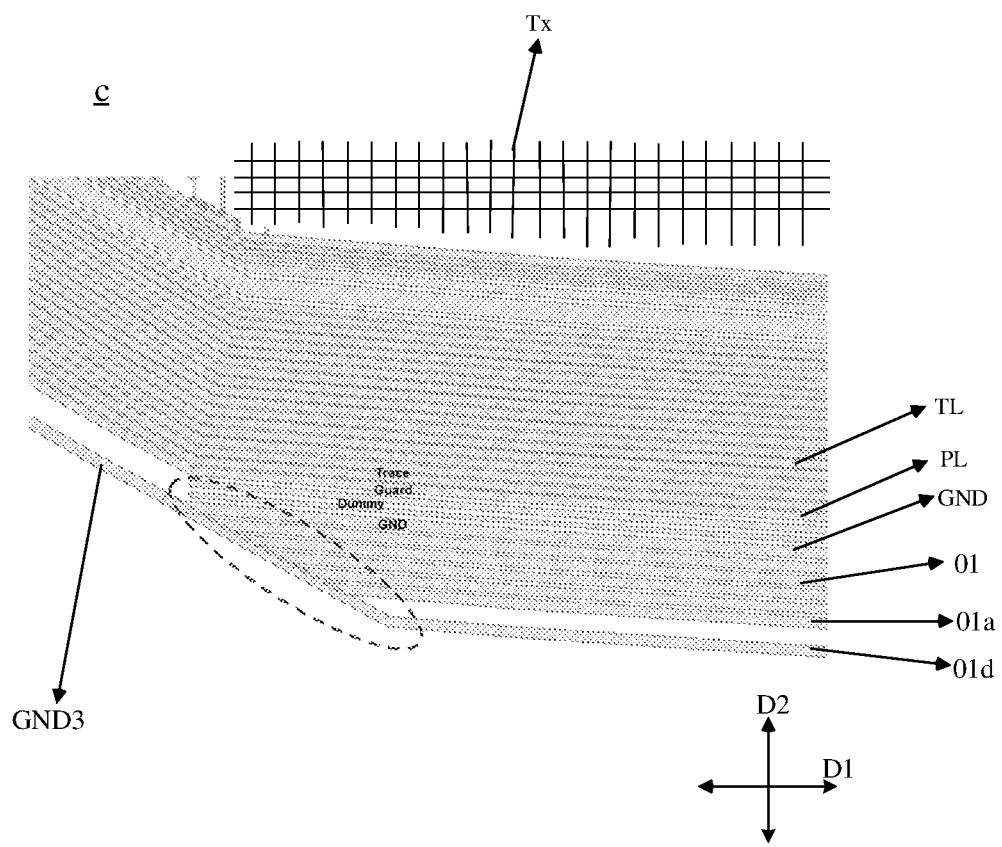
FIG. 5 is a schematic diagram of a part c of the display panel shown in FIG. 1 including a light-shielding line.

For example, a first end of each of the plurality of auxiliary ground lines 01 is connected with the second part GND2 of the main ground line GND, and a second end of each of the plurality of auxiliary ground lines 01 is connected or not connected with the first part GND1 of the main ground line GND. With reference to FIG. 1, the first part GND1 of the main ground line GND includes: a first sub-part GND-1 (that is, the part of the first part GND1 in FIG. 4B extending along the first edge), a second sub-part GND-2 and a bent part GND-3. The first sub-part is the first part GND1 of the GND in FIG. 4B which extends along the first edge 11; as shown in FIGS. 1 and 4E, the second sub-part GND-2 extends along the second edge 12; as shown in FIG. 1 and FIG. 5, the bent part GND-3 is located at a junction region of the first edge 11 and the second edge 12, connecting the first sub-section and the second sub-section. For example, the at least one auxiliary ground line 01 extends along the first edge 11.

As shown in FIG. 5, in the case that the second end of each of the plurality of auxiliary ground lines 01 is connected with the first part GND1 of the main ground line GND, that is, the second ends of each of the plurality of auxiliary ground lines 01 converge, for example, the second end of each of the at least one auxiliary ground line 01 is connected with the bent part GND-3.

For example, as shown in FIG. 4B, the plurality of auxiliary ground lines 01 are all substantially parallel to the first part GND1 of the main ground line GND, that is, the extension directions of all the plurality of auxiliary ground lines 01 and the first part GND1 of the main ground line GND are consistent, not limited to the case of absolute parallelism, for example, deviations within 5° from each other can be considered as substantially parallel. For example, the line width of each of the at least one auxiliary ground line 01 in the direction from the display region 101 to the non-display region 102 is equal to the line width of the first part GND1 of the main ground line GND in the direction from the display region 101 to the non-display region 102, and the plurality of auxiliary ground lines 01 and the first part GND1 of the main ground line GND are arranged at equal intervals from each other. Patterns of various lines and electrodes, such as the touch electrode lines TL, the main ground lines GND, the auxiliary ground lines 01 and the light-shielding lines, are usually formed through a patterning process including an etching step, in this way, the plurality of auxiliary ground lines 01 and the first parts GND1 of the main ground lines GND can have better etching uniformity, thereby can shield the first light leakage region 103a more completely, and a better effect of preventing light leakage at the edge of the display panel is obtained.

For example, as shown in FIG. 4B, the display panel 10 further includes an auxiliary connection part 011, the auxiliary connection part 011 is across a gap between two adjacent auxiliary ground lines 01 among the at least one auxiliary ground line 01 and is connected with both the adjacent two auxiliary ground lines 01, so that the plurality of auxiliary ground lines 01 are provided with a same ground signal, uniformity of the signals of the plurality of auxiliary ground lines 01 is ensured, and the stability of the touch signals transmitted by the touch electrode lines TL located inside the plurality of auxiliary ground lines 01 is enhanced.

Figure 7A:
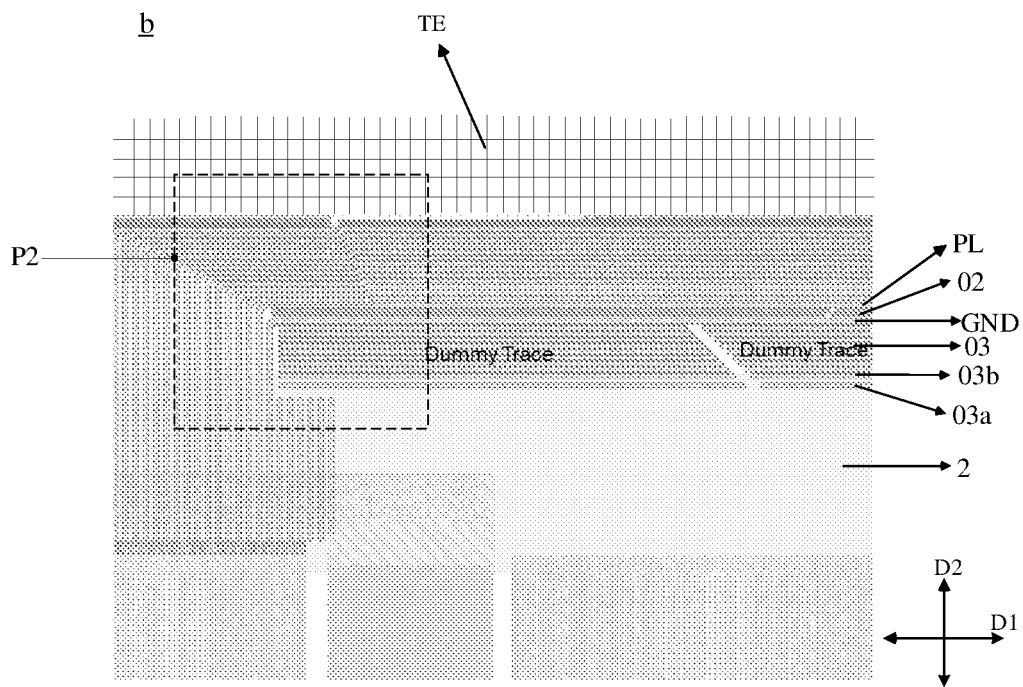
FIG. 7A is an enlarged schematic diagram of the part b in FIG. 4A of another display panel provided by an embodiment of the present disclosure.
Figure 7B:
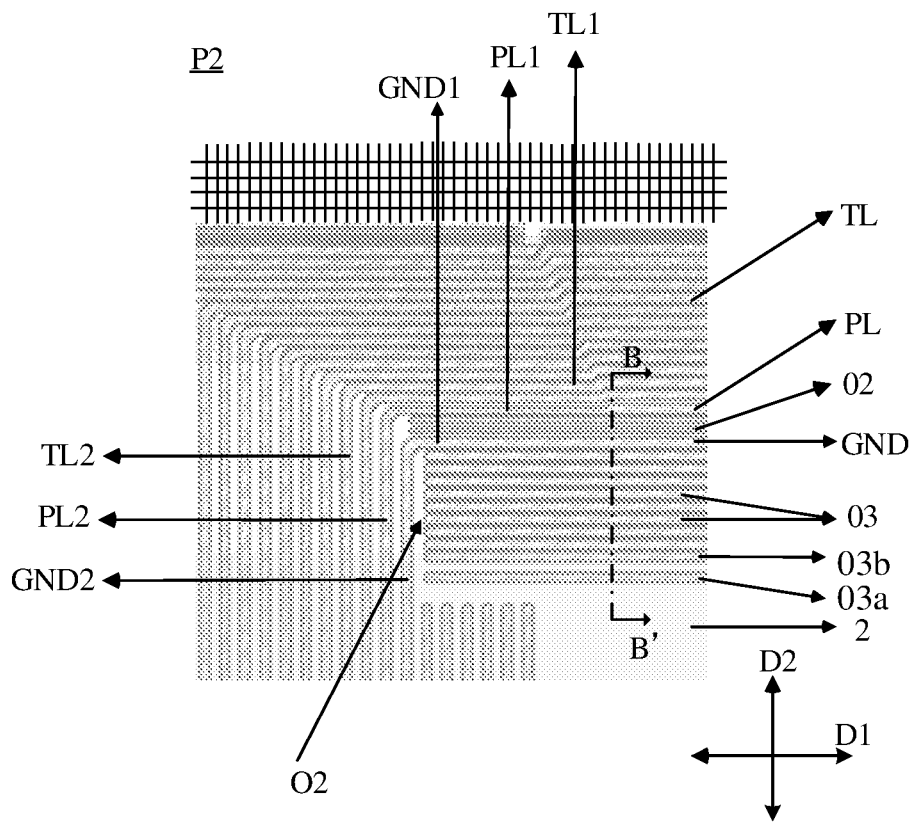
FIG. 7B is an enlarged schematic diagram of a part P2 in FIG. 7A.
Figure 7C:
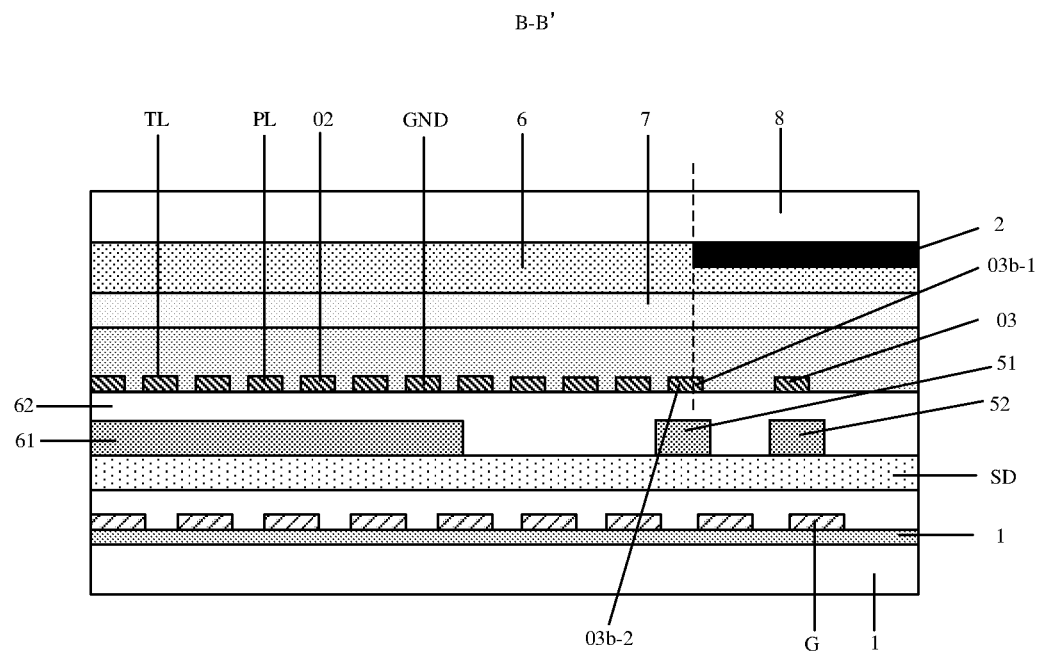
FIG. 7C is a cross-sectional schematic diagram taken along the line B-B' in FIG. 7B.

Or, in another embodiment, for example, FIG. 7A is an enlarged schematic diagram of another display panel at the part b in FIG. 4A provided by an embodiment of the present disclosure; FIG. 7B is an enlarged schematic diagram of the part P2 in FIG. 7A; and FIG. 7C is a cross-sectional schematic diagram taken along the line B-B' in FIG. 7B. As shown in FIGS. 7A to 7C, at least one light-shielding line further includes at least one first floating line 03, in this embodiment, the light-shielding lines include a plurality of first floating lines 03. The plurality of first floating lines 03 extend along the first part GND1 of the main ground line GND, and are located on a side of the main ground line GND away from the display region 101, and are disconnected from the main ground line GND; for example, as shown in FIG. 7B, an interval 02 is between the plurality of first floating lines 03 and the second part GND2 of the main ground line GND. The entire range, in the line width direction of the first floating line 03a, of the orthographic projection of the first floating line 03a farthest away from the display region 101 on the substrate 1 among the plurality of first floating lines 03 is overlapped with the orthographic projection of the light-shielding layer 2 on the substrate 1, to ensure that there is still no light leakage region as far as possible after the lamination deviation of the light-shielding layer 2, and a better effect of preventing light leakage at the edge of the display panel is obtained. In addition, the orthographic projection of some first floating lines 03 among the plurality of first floating lines 03 on the substrate 1 is located between the edge of the orthographic projection of the light-shielding layer 2 on the substrate 1 close to the display region 101 and the edge of the first part GND1 of the main ground line GND away from the display region 101, to block the first light leakage region 103a. The first floating line 03b in FIG. 7B is the edge light-shielding line, the orthographic projection of the first part 03b-1 of the first floating line 03b on the substrate 1 is at least partially overlapped with the orthographic projection of the light-shielding layer 2 on the substrate 1, and the orthographic projection of the second part 03b-2 of the first floating line 03b on the substrate 1 is located between the edge of the orthographic projection of the light-shielding layer 2 on the substrate 1 close to the display region 101 and the edge of the first part GND1 of the main ground line GND away from the display region 101, to better shield the light leakage region near the edge of the display region 101 of the orthographic projection of the light-shielding layer 2 on the substrate 1, and better shield the gap between the edge of the light-shielding layer 2 close to the display region 101 and the edge of the touch signal line TL away from the display region 101 is further ensured, so that a better light leakage prevention effect is obtained.

For example, in another embodiment, the first floating line 03a in FIG. 7B may be removed, in this case, the first floating line farthest away from the display region 101 among the plurality of first floating lines 03 is the first floating line 03b, at the same time, the first floating line farthest away from the display region 101 among the plurality of first floating lines 03, that is the first floating line 03b, is also the edge light-shielding line, the orthographic projection of the first part 03b-1 of the first floating line 03b on the substrate 1 is at least partially overlapped with the orthographic projection of the light-shielding layer 2 on the substrate 1, the orthographic projection of the second part 03b-2 of the first floating line 03b on the substrate 1 is located between the edge of the orthographic projection of the light-shielding layer 2 on the substrate 1 close to the display region 101 and an edge away from the display region 101 of the first part GND1 of the main ground line GND, to better shield the first light leakage region 103a.

For example, the shapes and extension trends of the plurality of first floating lines 03 may be the same as those of the auxiliary electrode lines 01 in FIG. 4B.

For example, each of the at least one first floating line 03 is substantially parallel to the first part GND1 of the main ground line GND; and the line width of each of the at least one first floating line 03 in the direction from the display region 101 to the non-display region 102 is equal to the line width of the first part GND1 of the main ground line GND in the direction from the display region 101 to the non-display region 102, and the at least one first floating line 03 and the first part GND1 of the main ground line GND are arranged at equal intervals from each other. Patterns of various lines and electrodes, such as the touch electrode lines TL, the main ground line GND, the first floating lines 03 and the light-shielding lines, are usually formed through a patterning process including an etching step, in this way, the plurality of first floating lines 03 and the first part GND1 of the main ground line GND can have better etching uniformity, the shielding of the first light leakage region 103*a* is also stricter, and a better effect of preventing light leakage at the edge of the display panel is obtained.

For example, as shown in FIG. 7A, each of the first floating lines 03 may include a plurality of parts separated by breaks 01, so that the first floating lines 03 are disconnected to prevent electrostatic damage caused by a first floating line 03 being too long.

Other features of the embodiment shown in FIGS. 7A to 7C are the same as those in FIGS. 4A to 4B, and they can refer to the descriptions of FIGS. 4A to 4B.

For example, as shown in FIG. 4B, the display panel 10 further includes a protection line PL, the protection line PL is arranged along the touch signal lines TL and is located between the touch signal lines TL and the main ground line GND, a waveform of the electrical signal transmitted by the protection line PL is basically the same as a waveform of the electrical signal transmitted by the touch signal line TL. The protection line PL includes a first part PL1 surrounding the display region 101, the protection line PL can prevent the signal of the touch signal line TL at the edge position from jumping. The at least one light-shielding line includes a second floating line 02, the second floating line 02 is located between the first part PL1 of the protection line PL and the first part GND1 of the main ground line GND, and does not transmit electrical signals.

For example, the second floating line 02 is substantially parallel to the first part PL1 of the protection line PL and the first part GND1 of the main ground line GND; and the line width of the second floating line 02 in the direction from the display region 101 to the non-display region 102 is smaller than the line width of the first part PL1 of the protection line PL in the direction from the display region 101 to the non-display region 102, and is less than the line width of the first part GND1 of the main ground line GND in the direction from the display region 101 to the non-display region 102, in this way, in the case that the second light leakage region 103*b* (as shown in FIG. 3) is narrower than the first light leakage region 103*a*, it can be better adapted to the narrow second light leakage region 103*b* between the first part PL1 of the protection line PL and the first part GND1 of the main ground line GND. Or, the line width of the second floating line 02 in the direction from the display region 101 to the non-display region 102 is equal to the line width of the first part PL1 of the protection line PL in the direction from the display region 101 to the non-display region 102, and is equal to the line width of the first part GND1 of the main ground line GND in the direction from the display region 101 to the non-display region 102. It may be selected based on the widths of the first light leakage region 103*a* and the second light leakage region 103*b*.

For example, as shown in FIG. 4B, the protection line PL further includes a second part PL2 connected with the first part PL1 of the protection line PL, and an extension direction of the second part PL2 of the protection line PL is intersected with an extension direction of the first part PL1 of the protection line PL. For example, the first part PL1 of the protection line PL extends along the first direction D1, and the second part PL2 of the protection line PL extends in the second direction D2. Each of the touch signal lines TL includes a first part TL1 surrounding the display region 101 and a second part TL2 connected with the first part TL1 of the corresponding touch signal line TL, the extension direction of the second part TL2 of the touch signal line TL is intersected with the extension direction of the first part TL1 of the corresponding touch signal line TL. The integrated circuit board 4 comprises a plurality of integrated circuit board pins, the second part GND2 of the main ground line GND, the second part PL2 of the protection line PL, and the second part TL2 of the touch signal line TL are respectively connected with the plurality of integrated circuit board pins.

Figure 4C:
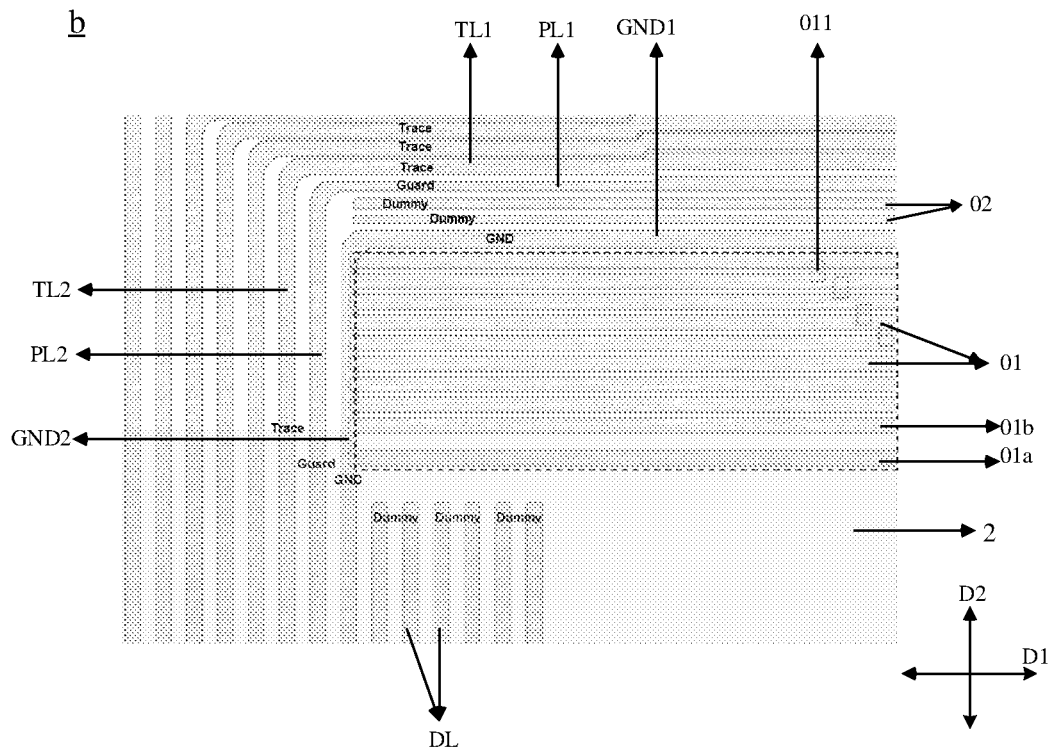
FIG. 4C is an enlarged schematic diagram of a part b including a light-shielding line in FIG. 4A.
Figure 4D:
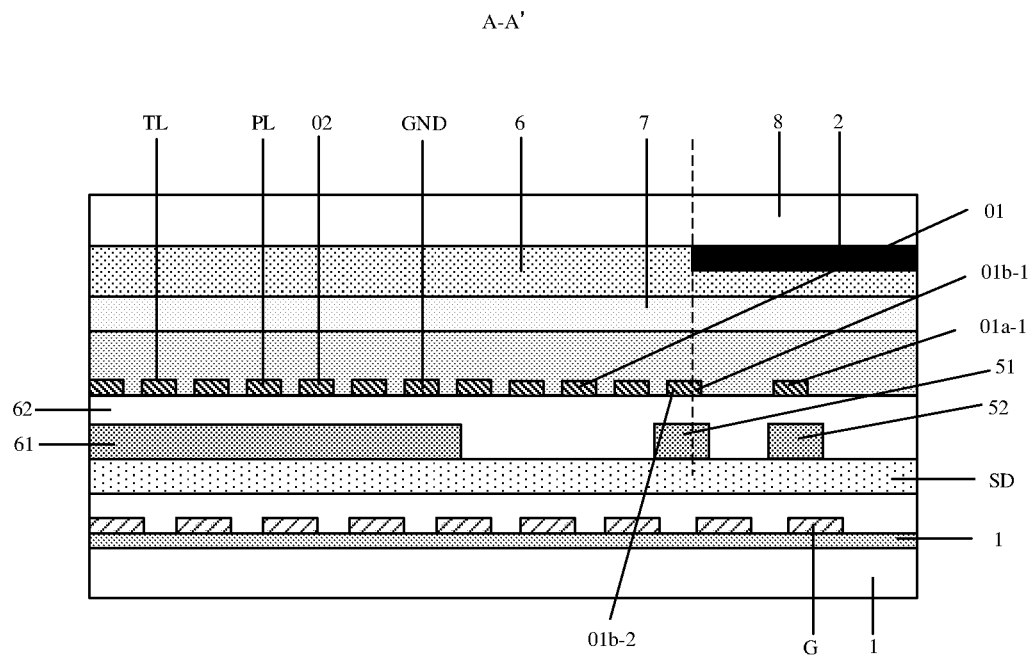
FIG. 4D is a cross-sectional schematic diagram taken along a line A-A' in FIG. 4A.

FIG. 4C is an enlarged schematic diagram of the part b including the light-shielding lines in FIG. 4A. Each of the structures in FIG. 4C has the same features as those corresponding to the same structures shown in FIG. 4B, but the positions thereof are different. Part a is on the first side of the integrated circuit board 4 in the first direction D1, and part b is on the second side of the integrated circuit board 4 opposite to the first side of the integrated circuit board 4 in the first direction D1.

Figure 8A:
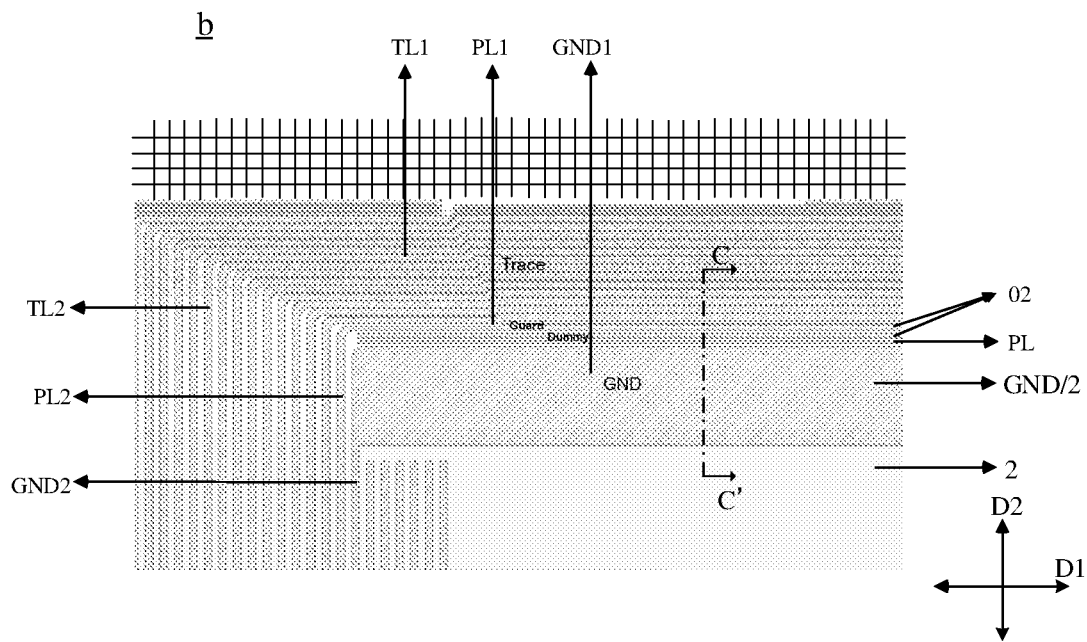
FIG. 8A is an enlarged schematic diagram of the part b in FIG. 4A of further another display panel provided by an embodiment of the present disclosure.
Figure 8B:
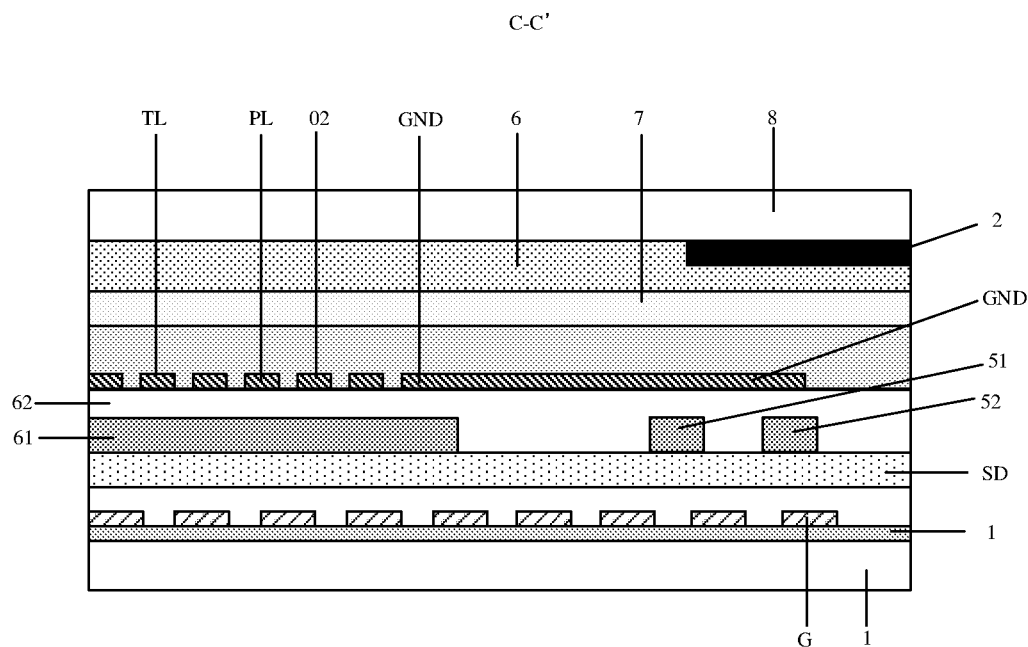
FIG. 8B is a cross-sectional schematic diagram taken along the line C-C' in FIG. 8A.

FIG. 8A is an enlarged schematic diagram of the part b in FIG. 4A of another display panel provided by an embodiment of the present disclosure; and FIG. 8B is a cross-sectional schematic diagram taken along the line C-C' in FIG. 8A. The display panel shown in FIG. 8A has the following differences from the display panel shown in FIGS. 4A to 4B, for example, as shown in FIGS. 8A to 8B, the at least one light-shielding line includes a first part GND1 of the main ground line GND, and the number of the main ground line GND is 1; the line width of the one main ground line GND in the direction from the display region 101 to the non-display region 102 is greater than the line width of any one of the touch signal lines TL in the direction from the display region 101 to the non-display region 102, an orthographic projection of the first part GND1 of the main ground line GND on the substrate 1 is at least partially overlapped with the orthographic projection of the light-shielding layer 2 on the substrate 1, and an orthographic projection of a part of the first part GND1 of the main ground line GND on the substrate 1 is located between an edge of the orthographic projection of the light-shielding layer 2 on the substrate 1 close to the display region 101 and an edge of the touch signal line TL away from the display region 101, to achieve the effect of more completely shielding the first light leakage region 103*a*.

Other features of the embodiment shown in FIG. 8A are the same as those in FIGS. 4A to 4B, and can be referred to the descriptions of FIGS. 4A to 4B.

For example, as shown in FIG. 4D, the at least one light-shielding line is made of a same material as the touch signal lines TL, and the at least one light-shielding line and the touch signal lines TL are arranged in the same layer, for example the at least one light-shielding line may all be in the same layer. For example, the light-shielding line and the touch signal lines TL are made of a same material as the first touch electrode channel 410 and the second touch electrode channel 420, and the light-shielding lines, the touch signal lines TL, the first touch electrode channels 410 and the second touch electrode channels 420 are arranged in a same layer, or, the light-shielding lines, the touch signal lines TL and the bridge electrode 412 are made of a same material and arranged in a same layer.

For example, the plurality of light-shielding lines may also be arranged in a plurality of layers. FIG. 4E is another cross-sectional schematic diagram taken along the line A-A' in FIG. 4A, as shown in FIG. 4E, the plurality of light-shielding lines include the first part light-shielding lines 01-1 and the second part light-shielding lines 01-2, the first part light-shielding lines 01-1 are made of a same material as the touch signal lines TL, the first part light-shielding lines and the touch signal lines TL are arranged in a same layer, and the second part light-shielding lines 01-2 are arranged in a layer different from that in which the touch signal lines TL are located.

For example, as shown in FIG. 4E, intervals are provided between adjacent first part light-shielding lines 01-1, orthographic projections of the second part light-shielding lines on the substrate 1 are at least partially overlapped with orthographic projections of the intervals between the adjacent first part light-shielding lines 01-1 on the substrate 1, to further enhance the light-shielding effect. For example, the orthographic projections of the intervals between the adjacent first part light-shielding lines 01-1 completely fall within the orthographic projections of the second part light-shielding lines 01-2.

For example, the first part light-shielding lines 01-1 are made of a same material as the first touch electrode channels 410 and the second touch electrode channels 420, and the first part light-shielding lines 01-1, the first touch electrode channels 410 and the second touch electrode channels 420 are arranged in a same layer. The second part light-shielding lines 01-2 are made of a same material as the bridge electrodes 412, and the second part light-shielding lines 01-2 and the bridge electrodes 412 are arranged in a same layer. The first part light-shielding lines 01-1 and the first touch electrode channels 410 and the second touch electrode channels 420 may be formed by performing a same patterning process on a same layer, the second part light-shielding lines 01-2 and the bridge electrodes 412 can be formed by performing a same patterning process in the same layer. In this way, there is no need to separately provide an additional conductive layer for arranging the light-shielding lines, which simplifies the structure of the display panel 10, and simplify the manufacturing process of the display panel 10.

Figure 6:
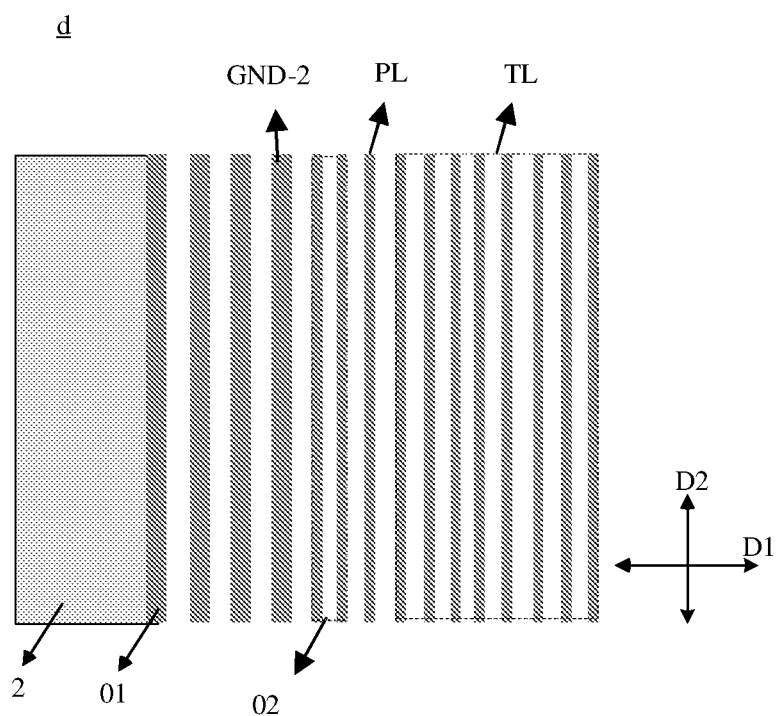
FIG. 6 is a schematic diagram of a part d including a light-shielding line in a part close to a second edge of the non-display region shown in FIG. 1.

FIG. 6 is a schematic diagram of the part d including a light-shielding line in the part close to a second edge of the non-display region shown in FIG. 1. As shown in FIG. 6, the light-shielding lines may also be arranged in the non-display region 102 near the second edge 12 of the display panel 10, the light-shielding lines here may include the auxiliary ground lines 01 or the first floating lines 03 similar to those in FIG. 4B, and may also include the second floating line 02 similar to that in FIG. 4B. The specific type and quantity can be designed according to the width of the non-display region 102 near the second edge 12 and the size of the light leakage region. Similarly, the above-mentioned light-shielding lines can also be arranged in the non-display region 102 near the third edge 13 and the fourth edge 14 of the display panel 10.

For example, referring to FIG. 1 and FIG. 4D, the display panel 10 further includes a dam glue 5, the dam glue 5 at least partially surrounds the display region 101, the touch signal lines TL are located on a side of the dam glue 5 close to the display region 101, the light-shielding layer 2 is at least partially overlapped with the dam glue 5 in the direction perpendicular to the substrate 1. The dam glue 5 is located on an outer side (the side away from the OLED light-emitting device) of the sealing layer used to seal the light-emitting device such as the OLED light-emitting device, to prevent the sealing material of the sealing layer from overflowing. For example, the dam glue 5 includes a first dam glue 51 and a second dam glue 52, and the second dam glue 52 is located outside the first dam glue 51, to further prevent the sealing material of the sealing layer from overflowing.

For example, referring to FIG. 4D, the display panel 10 further includes an encapsulation cover plate 8, the encapsulation cover plate 8 is opposite to the substrate 1, and the light-shielding layer 2 is located on a surface of the encapsulation cover plate 8 close to the substrate 1, for example, the light-shielding layer 2 is coated on the surface of the encapsulation cover plate 8 close to the substrate 1.

For example, the light-shielding layer 2 is away from the edge of the display region 101, is substantially overlapped with an edge of the bending region 104 close to the display region 101, and is overlapped with the edge of the encapsulation cover plate 8, to ensure a better light-shielding effect.

For example, referring to FIG. 4D, the display panel 10 further includes an optical adhesive layer 6, the optical adhesive layer 6 is located on a side of both the encapsulation cover plate 8 and the light-shielding layer 2 close to the substrate 1, the light-shielding layer 2 is in contact with the optical adhesive layer 6. For example, the material of the light-shielding layer 2 and the material of the optical adhesive layer 6 are both organic material, the light-shielding layer 2 is in contact with the optical adhesive layer 6 under the action of a strong binding force, which is conducive to the stability of the structure.

For example, referring to FIG. 4D, the display panel 10 further includes a polarization structure layer 7. The polarization structure layer 7 is located on a side of the optical adhesive layer 6 close to the substrate 1.

For example, referring to FIG. 4D, the display panel 10 further includes a pixel driver circuit layer configured to control operations of the display pixels, for example, the pixel driver circuit layer includes driving transistors, the driving transistors are configured to drive light emitting devices to emit light; for example, the pixel driver circuit layer also includes a data transistor and a compensation transistor. The pixel driver circuit layer includes a source-drain electrode layer SD and the gate electrode G in FIG. 4D as well as necessary insulation layers. The pixel driver circuit layer is located on a side of the polarization structure layer 7 close to the substrate 1. The display panel 10 also includes a touch electrode structure layer, the touch electrode structure layer includes the first touch electrode channel 410 and the second touch electrode channel 420, and the touch electrode structure layer is located between the pixel driver circuit layer and the polarization structure layer 7.

For example, the display panel 10 provided by the embodiment of the present disclosure may be an OLED touch display panel, for example may be an FMLOC panel. Of course, the display panel 10 provided in the embodiment of the present disclosure may be an OLED touch display panel, or may be other types of touch display panels.

Figure 9:
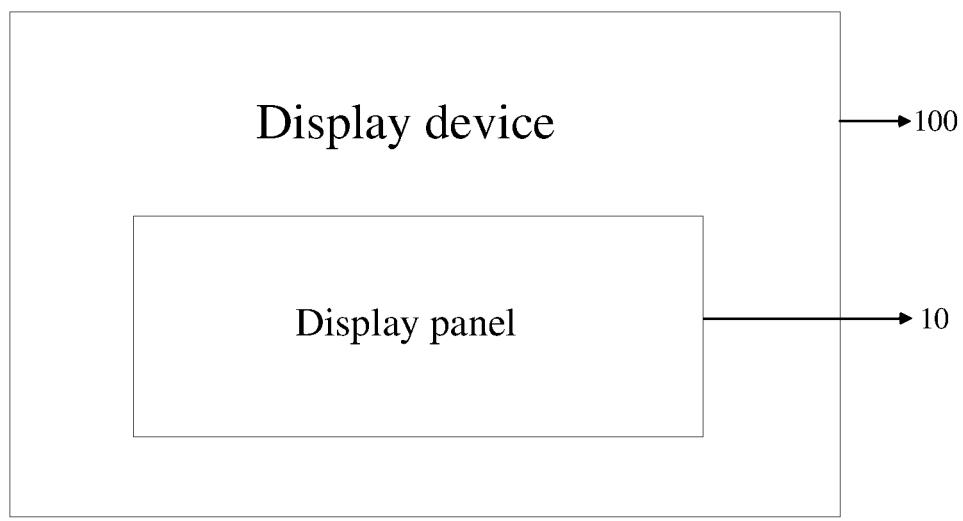
FIG. 9 is a schematic diagram of a display device provided by an embodiment of the present disclosure.

FIG. 9 is a schematic diagram of a display device provided by an embodiment of the present disclosure. As shown in FIG. 9, the at least one embodiment of the present disclosure further provides a display device 100, the display device 100 includes any one of the display panels 10 provided by the embodiments of the present disclosure. For example, the display device 100 may be a display panel, or any product or component with a display function such as a display, an OLED panel, an OLED TV, an electronic paper, a mobile phone, a tablet computer, a notebook computer, a digital photo frame, or a navigator.

The above descriptions are only exemplary implementations of the present disclosure, and are not intended to limit the protection scope of the present disclosure, and the protection scope of the present disclosure is determined according to the scope defined by the claims.

What is claimed is:

1. A display panel, comprising:
a substrate, comprising a display region and a non-display region at least partially surrounding the display region, wherein the display region comprises display pixels;
a light-shielding layer, in the non-display region and at least partially surrounding the display region;
a touch signal line, in the non-display region, at least partially surrounding the display region, wherein the light-shielding layer and the touch signal line are on a surface of and on a same side of the substrate, and the touch signal line is on a side of the light-shielding layer close to the display region in a direction parallel to the surface of the substrate, and configured to provide a touch signal to the display region; and
at least one light-shielding line, in the non-display region, at least partially surrounding the display region, wherein the light-shielding layer includes a portion which is on a side of all of the at least one light-shielding line and the touch signal line away from the display region in the direction parallel to the surface of the substrate; the at least one light-shielding line is arranged along a direction from the display region to the non-display region, an orthographic projection of a first part of the at least one light-shielding line on the substrate is overlapped with an orthographic projection of the light-shielding layer on the substrate, and an orthographic projection of a second part of the at least one light-shielding line on the substrate is between an edge of the orthographic projection of the light-shielding layer on the substrate close to the display region and an edge of the touch signal line away from the display region.

2. The display panel according to claim 1, wherein the at least one light-shielding line comprises an edge light-shielding line, an orthographic projection of a first part of the edge light-shielding line on the substrate is overlapped with a part of the orthographic projection of the light-shielding layer on the substrate, and an orthographic projection of a second part of the edge light-shielding line on the substrate is between the edge of the orthographic projection of the light-shielding layer on the substrate close to the display region and the edge of the touch signal line away from the display region.

3. The display panel according to claim 1, further comprising:
a first touch electrode, in the display region and comprising a plurality of first touch electrode channels extending along the first direction and arranged at intervals from each other,
wherein the plurality of touch signal lines are connected with the plurality of first touch electrode channels in one-to-one correspondence, and are configured to provide the touch signal to the corresponding first touch electrode channels respectively.

4. The display panel according to claim 3, further comprising:
a second touch electrode, in the display region and comprising a plurality of second touch electrode channels that extend along the second direction and are arranged at intervals from each other, wherein the second direction is intersected with the first direction; the plurality of second touch electrode channels and the plurality of first touch electrode channels are arranged in the same layer and are insulated from each other, each of the plurality of first touch electrode channels comprises a plurality of first sub-touch electrodes arranged at intervals, and each of the plurality of second touch electrode channels comprises a plurality of second sub-touch electrodes arranged at intervals; and
a bridge electrode, arranged in a layer different from that in which the plurality of second sub-touch electrodes and the plurality of first sub-touch electrodes are located, electrically connecting two adjacent first sub-touch electrodes among the plurality of first sub-touch electrodes of the same one first touch electrode channel, and insulated from the second touch electrode,
wherein both the light-shielding line and the touch signal line are made of a same material as the first touch electrode and the second touch electrode, and the light-shielding line, the touch signal line, the first touch electrodes and the second touch electrodes are in the same layer, or,
both the light-shielding line and the touch signal line are made of a same material as the bridge electrode, and the light-shielding line, the touch signal line and the bridge electrode are in the same layer.

5. The display panel according to claim 1, comprising:
a main ground line, arranged along the touch signal line, on a side of the touch signal line away from the display region, and comprising a first part surrounding the display region and a second part connected with the first part, wherein an extension direction of the second part is intersected with an extension direction of the first part; and
an integrated circuit board, configured to provide the display panel with a driving signal for controlling display, wherein the second part of the main ground line is electrically connected with the integrated circuit board.

6. The display panel according to claim 5, wherein the at least one light-shielding line comprises:
at least one auxiliary ground line, extending along the first part of the main ground line, and on a side of a first part of the main ground line away from the display region, wherein an orthographic projection of an auxiliary ground line farthest away from the display region among the at least one auxiliary ground line on the substrate is at least partially overlapped with the orthographic projection of the light-shielding layer on the substrate, and an orthographic projection of a part of the at least one auxiliary ground line on the substrate is between the edge of the orthographic projection of the light-shielding layer on the substrate close to the display region and an edge of the first part of the main ground line away from the display region; and
the auxiliary ground line is electrically connected with the main ground line, or, the auxiliary ground line is directly electrically connected with the integrated circuit board.

7. The display panel according to claim 6, wherein a first end of each of the at least one auxiliary ground line is connected with the second part of the main ground line, a second end of each of the at least one auxiliary ground line is connected or not connected with the first part of the main ground line;
the first part of the main ground line comprises:
a first sub-part, extending along the first edge;
a second sub-part, extending along the second edge;
a bent part, at a junction region between the first edge and the second edge, and connecting the first sub-part and the second sub-part, wherein the at least one auxiliary ground line extends along the first edge; and in a case that the second end of each of the at least one auxiliary ground line is connected with the first part of the main ground line, the second end of each of the at least one auxiliary ground line is connected with the bent part.

8. The display panel according to claim 6, wherein the at least one auxiliary ground line is substantially parallel to the first part of the main ground line; and
a line width of each of the at least one auxiliary ground line in the direction from the display region to the non-display region is equal to a line width of the first part of the main ground line in the direction from the display region to the non-display region, and the at least one auxiliary ground line and the first part of the main ground line are arranged at an equal interval from each other.

9. The display panel according to claim 8, further comprising:
an auxiliary connection part, across a gap between two adjacent auxiliary ground lines among the at least one auxiliary ground line and connecting the two adjacent auxiliary ground lines.

10. The display panel according to claim 5, wherein the at least one light-shielding line comprises the first part of the main ground line, and a total number of the main ground line is 1;
a line width of one of the main ground line in the direction from the display region to the non-display region is greater than a line width of one of the touch signal line in the direction from the display region to the non-display region, an orthographic projection of the first part of the main ground line on the substrate is at least partially overlapped with the orthographic projection of the light-shielding layer on the substrate, and an orthographic projection of the first part of part of the main ground line on the substrate is between the edge of the orthographic projection of the light-shielding layer on the substrate close to the display region and the edge of a touch signal line away from the display region.

11. The display panel according to claim 5, wherein the at least one light-shielding line comprises:
at least one first floating line, extending along the first part of the main ground line, on a side of the main ground line away from the display region, and disconnected with the main ground line, wherein an orthographic projection of a first floating line farthest away from the display region among the at least one first floating line on the substrate is at least partially overlapped with the orthographic projection of the light-shielding layer on the substrate, an orthographic projection of a part of the at least one first floating line on the substrate is between the edge of the orthographic projection of the light-shielding layer on the substrate close to the display region and an edge of the first part of the main ground line away from the display region.

12. The display panel according to claim 11, wherein each of the at least one first floating line is substantially parallel to the first part of the main ground line; and
a line width of each of the at least one first floating line in the direction from the display region to the non-display region is equal to a line width of the first part of the main ground line in the direction from the display region to the non-display region, and the at least one first floating line and the first part of the main ground line are arranged at an equal interval from each other.

13. The display panel according to claim 6, further comprising:
a protection line, arranged along the touch signal line and between the touch signal line and the main ground line, a waveform of an electrical signal transmitted by the protection line is basically same as a waveform of an electrical signal transmitted by the touch signal line, wherein the protection line comprises a first part surrounding the display region;
the at least one light-shielding line comprises:
a second floating line, wherein the second floating line is between the first part of the protection line and the first part of the main ground line, and does not transmit any electrical signal.

14. The display panel according to claim 13, wherein the second floating line is substantially parallel to the first part of the protection line and the first part of the main ground line; and
a line width of the second floating line in the direction from the display region to the non-display region is smaller than a line width of the first part of the protection line in the direction from the display region to the non-display region, and is less than a line width of the first part of the main ground line in the direction from the display region to the non-display region; or,
the line width of the second floating line in the direction from the display region to the non-display region is equal to the line width of the first part of the protection line in the direction from the display region to the non-display region, and is equal to the line width of the first part of the main ground line in the direction from the display region to the non-display region.

15. The display panel according to claim 13, wherein the protection line further comprises a second part connected with the first part of the protection line, an extension direction of the second part of the protection line is intersected with an extension direction of the first part of the protection line;
the touch signal line comprises a first part surrounding the display region and a second part connected with the first part of the touch signal line, an extension direction of the second part of the touch signal line is intersected with the extension direction of the first part of the touch signal line;
the integrated circuit board comprises a plurality of integrated circuit board pins, the second part of the main ground line, the second part of the protection line, and the second part of the touch signal line are respectively connected with the plurality of integrated circuit board pins.

16. The display panel according to claim 1, wherein the at least one light-shielding is made of a same material as the touch signal line and arranged in a same layer.

17. The display panel according to claim 1, wherein the at least one light-shielding line comprises a first part light-shielding line and a second part light-shielding line, the first part light-shielding line is made of a same material as the touch signal line and in a same layer as the touch signal line, and the second part light-shielding line and the touch signal line are respectively in different layers;
the first part light-shielding lines are arranged at intervals from each other, an orthographic projection of the second part light-shielding line on the substrate is at least partially overlapped with an orthographic projection of the intervals among the first part light-shielding lines on the substrate;

the display panel further comprises:
a second touch electrode, in the display region and comprising a plurality of second touch electrode channels extending along the second direction and arranged at intervals from each other, wherein the second direction is intersected the first direction; the plurality of second touch electrode channels and the plurality of first sub-touch channels are in a same layer and are insulated from each other, the plurality of second touch electrode channels comprise a plurality of second sub-touch electrodes arranged at intervals; and
a bridge electrode, arranged in a layer different from that in which the plurality of second sub-touch electrodes and the plurality of first sub-electrodes are located, electrically connecting two adjacent first sub-touch electrodes among the plurality of first sub-touch electrodes of the same one second touch electrode channel, and insulated from the second touch electrode,
wherein the first part of the light-shielding line is made of a same material as both the first touch electrodes and the second touch electrodes, and the first part of the light-shielding line, the first touch electrodes and the second touch electrodes are in a same layer, and the second part of the light-shielding line is made of a same material as the bridge electrode, and the second part of the light-shielding line and the bridge electrode are in a same layer.

18. A display device, comprising the display panel according to claim 1.

19. A display panel, comprising:
a substrate, comprising a display region and a non-display region at least partially surrounding the display region, wherein the display region comprises display pixels;
a light-shielding layer, in the non-display region and at least partially surrounding the display region;
a touch signal line, in the non-display region, at least partially surrounding the display region, on a side of the light-shielding layer close to the display region, and configured to provide a touch signal to the display region; and
at least one light-shielding line, in the non-display region, at least partially surrounding the display region, and on a side of the touch signal line away from the display region, wherein the at least one light-shielding line is arranged along a direction from the display region to the non-display region, an orthographic projection of a first part of the at least one light-shielding line on the substrate is overlapped with an orthographic projection of the light-shielding layer on the substrate, and an orthographic projection of a second part of the at least one light-shielding line on the substrate is between an edge of the orthographic projection of the light-shielding layer on the substrate close to the display region and an edge of the touch signal line away from the display region;
an entire range, in a line width direction of the at least one light-shielding line, of an orthographic projection of a light-shielding line farthest away from the display region among the at least one light-shielding line on the substrate is overlapped with the orthographic projection of the light-shielding layer on the substrate, and a light-shielding line of the at least one light-shielding line adjacent to the light-shielding line farthest away from the display region among the at least one light-shielding line is the edge light-shielding line;
or, among the at least one light-shielding line, the light-shielding line farthest away from the display region is the edge light-shielding line.

20. A display panel, comprising:
a substrate, comprising a display region and a non-display region at least partially surrounding the display region, wherein the display region comprises display pixels;
a light-shielding layer, in the non-display region and at least partially surrounding the display region;
a touch signal line, in the non-display region, at least partially surrounding the display region, on a side of the light-shielding layer close to the display region, and configured to provide a touch signal to the display region; and
at least one light-shielding line, in the non-display region, at least partially surrounding the display region, and on a side of the touch signal line away from the display region, wherein the at least one light-shielding line is arranged along a direction from the display region to the non-display region, an orthographic projection of a first part of the at least one light-shielding line on the substrate is overlapped with an orthographic projection of the light-shielding layer on the substrate, and an orthographic projection of a second part of the at least one light-shielding line on the substrate is between an edge of the orthographic projection of the light-shielding layer on the substrate close to the display region and an edge of the touch signal line away from the display region;
the display panel further comprises:
a main ground line, arranged along the touch signal line, on a side of the touch signal line away from the display region, and comprising a first part surrounding the display region and a second part connected with the first part, wherein an extension direction of the second part is intersected with an extension direction of the first part; and
an integrated circuit board, configured to provide the display panel with a driving signal for controlling display, wherein the second part of the main ground line is electrically connected with the integrated circuit board;
the substrate further comprises a bendable part at an edge of the non-display region away from the display region, and an extension part connected with the bendable part; the display panel has a first side for display and a second side opposite to the first side, the extension part is connected with the bendable part and is able to be bent to the second side of the display panel through the bendable part; the integrated circuit board is in the extension part;
the display panel has a first edge, a second edge intersecting the first edge, a third edge opposite to the first edge, and a fourth edge opposite to the second edge, and the extension part is arranged along the first edge of the display panel;
the at least one light-shielding line extends along at least part of the first edge, or, the at least one light-shielding line extends along at least part of the first edge and along at least one selected from a group consisting of the second edge, the third edge and the fourth edge.

* * * * *